(12) United States Patent
Kitano et al.

(10) Patent No.: US 7,935,563 B2
(45) Date of Patent: May 3, 2011

(54) SOLID-STATE IMAGING DEVICE AND METHOD FOR MANUFACTURING THEREOF AS WELL AS DRIVING METHOD OF SOLID-STATE IMAGING DEVICE

(75) Inventors: Yoshiaki Kitano, Kanagawa (JP); Hideshi Abe, Kanagawa (JP); Jun Kuroiwa, Kanagawa (JP); Kiyoshi Hirata, Kanagawa (JP); Hiroaki Ohki, Kanagawa (JP); Nobuhiro Karasawa, Kanagawa (JP); Ritsuo Takizawa, Tokyo (JP); Mitsuru Yamashita, Kanagawa (JP); Mitsuru Sato, Kanagawa (JP); Katsunori Kokubun, Kanagawa (JP)

(73) Assignee: Sony Corporation, Tokyo (JP)

( * ) Notice: Subject to any disclaimer, the term of this patent is extended or adjusted under 35 U.S.C. 154(b) by 221 days.

(21) Appl. No.: 12/323,019

(22) Filed: Nov. 25, 2008

(65) Prior Publication Data

US 2009/0075418 A1 Mar. 19, 2009

Related U.S. Application Data

(62) Division of application No. 10/548,182, filed as application No. PCT/JP2004/002817 on Mar. 5, 2004, now Pat. No. 7,473,977.

(30) Foreign Application Priority Data

Mar. 6, 2003 (JP) ................. 2003-060328
Mar. 31, 2003 (JP) ................. 2003-094120

(51) Int. Cl.
*H01L 27/146* (2006.01)

(52) U.S. Cl. ............ 438/72; 438/80; 257/E31.122

(58) Field of Classification Search ............ 257/233, 257/294, 435, E31.122; 438/72, 80
See application file for complete search history.

(56) References Cited

U.S. PATENT DOCUMENTS

| 5,349,216 A | 9/1994 | Lee et al. |
| 5,448,097 A * | 9/1995 | Mizushima et al. ......... 257/435 |
| 5,736,756 A * | 4/1998 | Wakayama et al. ......... 257/223 |
| 6,281,034 B1 | 8/2001 | Sugimoto et al. |
| 6,801,253 B1 | 10/2004 | Yonemoto et al. |
| 6,809,359 B2 * | 10/2004 | Yamada ................. 257/292 |

FOREIGN PATENT DOCUMENTS

| JP | 06-216361 | 8/1994 |
| JP | 07-142696 | 6/1995 |
| JP | 07-302891 | 11/1995 |
| JP | 11-274450 | 10/1999 |
| JP | 2002-051267 | 2/2002 |
| JP | 2002-198510 | 7/2002 |

* cited by examiner

*Primary Examiner* — Jerome Jackson, Jr.
*Assistant Examiner* — Paul A Budd
(74) *Attorney, Agent, or Firm* — SNR Denton US LLP

(57) ABSTRACT

A solid-state imaging device with a structure such that an electrode for reading a signal charge is provided on one side of a light-receiving sensor portion constituting a pixel; a predetermined voltage signal V is applied to a light-shielding film formed to cover an image pickup area except the light-receiving sensor portion; a second-conductivity-type semiconductor area is formed in the center on the surface of a first-conductivity-type semiconductor area constituting a photo-electric conversion area of the light-receiving sensor portion; and areas containing a lower impurity concentration than that of the second-conductivity-type semiconductor area is formed on the surface of the first-conductivity-type semiconductor area at the end on the side of the electrode and at the opposite end on the side of a pixel-separation area.

2 Claims, 26 Drawing Sheets

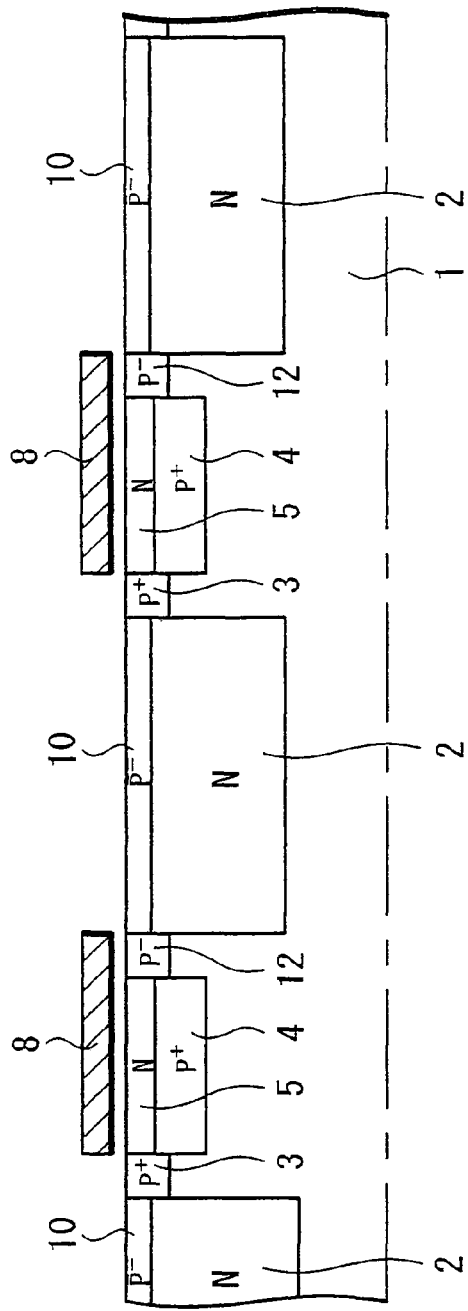
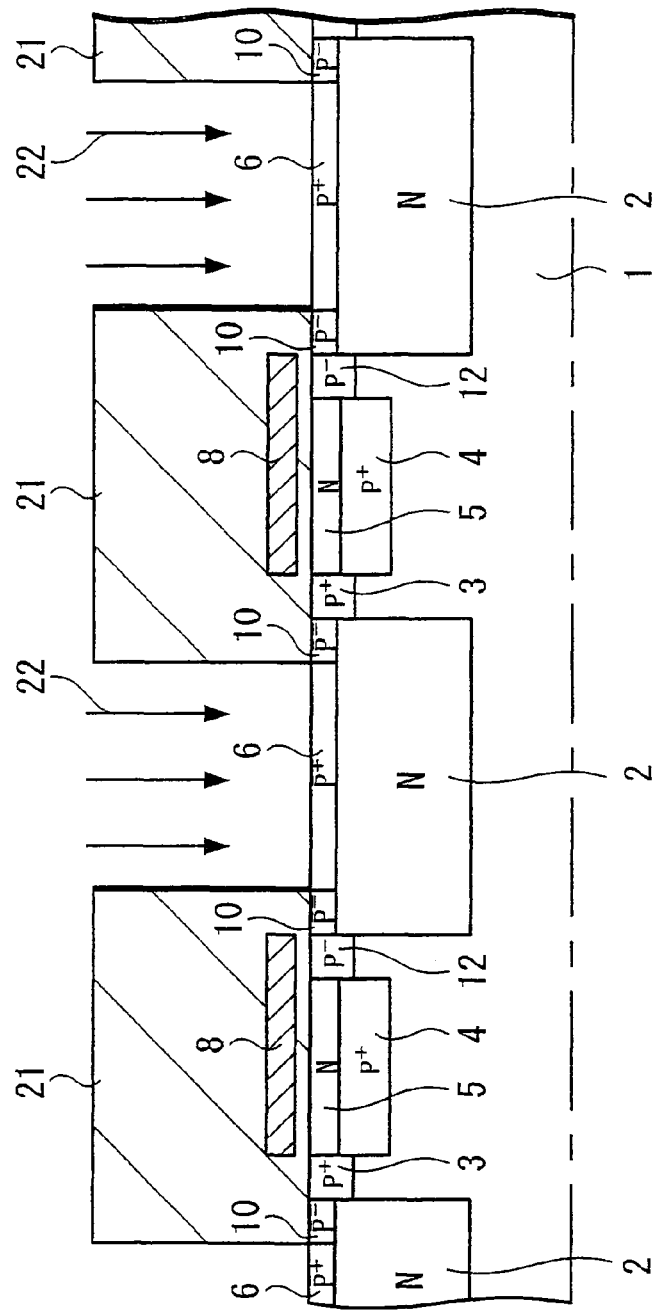
FIG. 2A
FIG. 2B

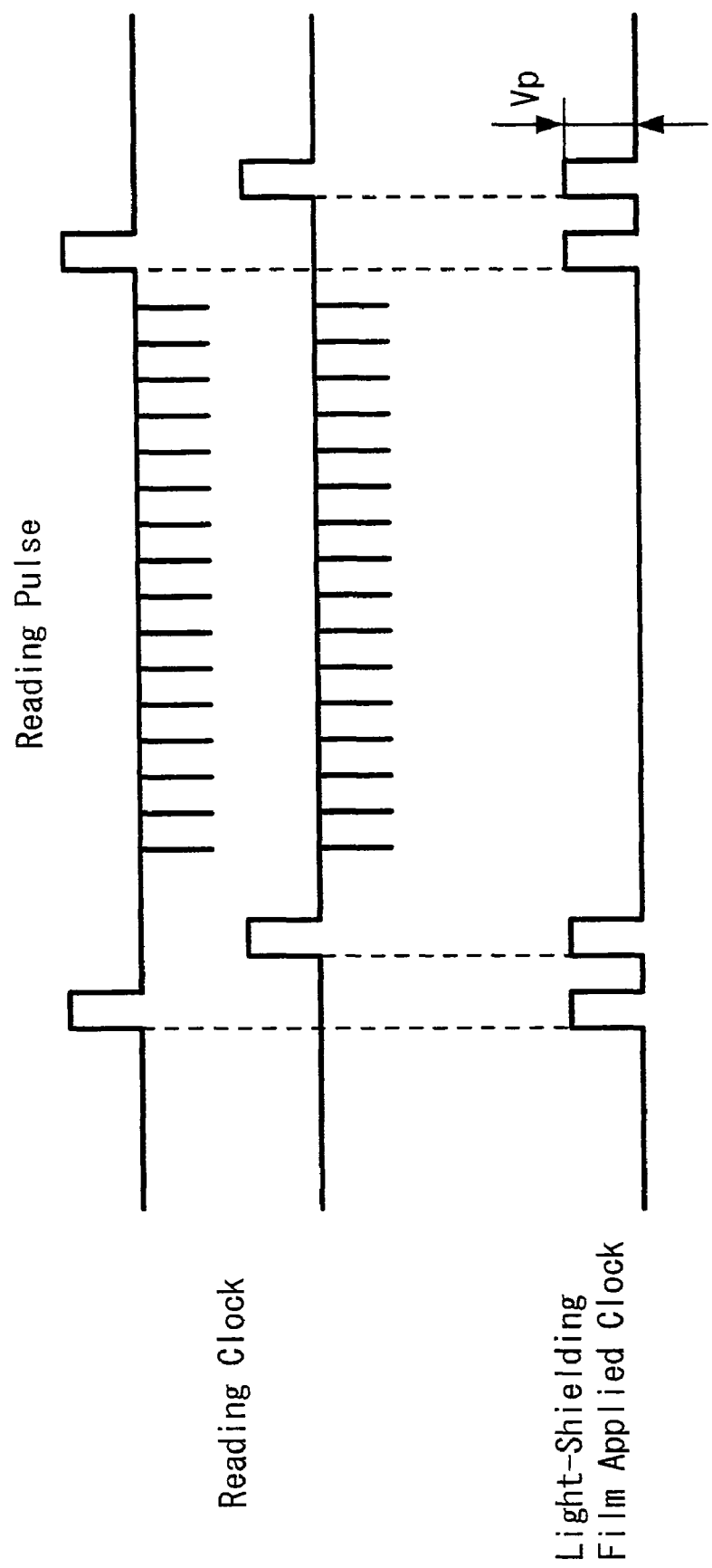

Vertical Transfer Register    Vertical Transfer Register

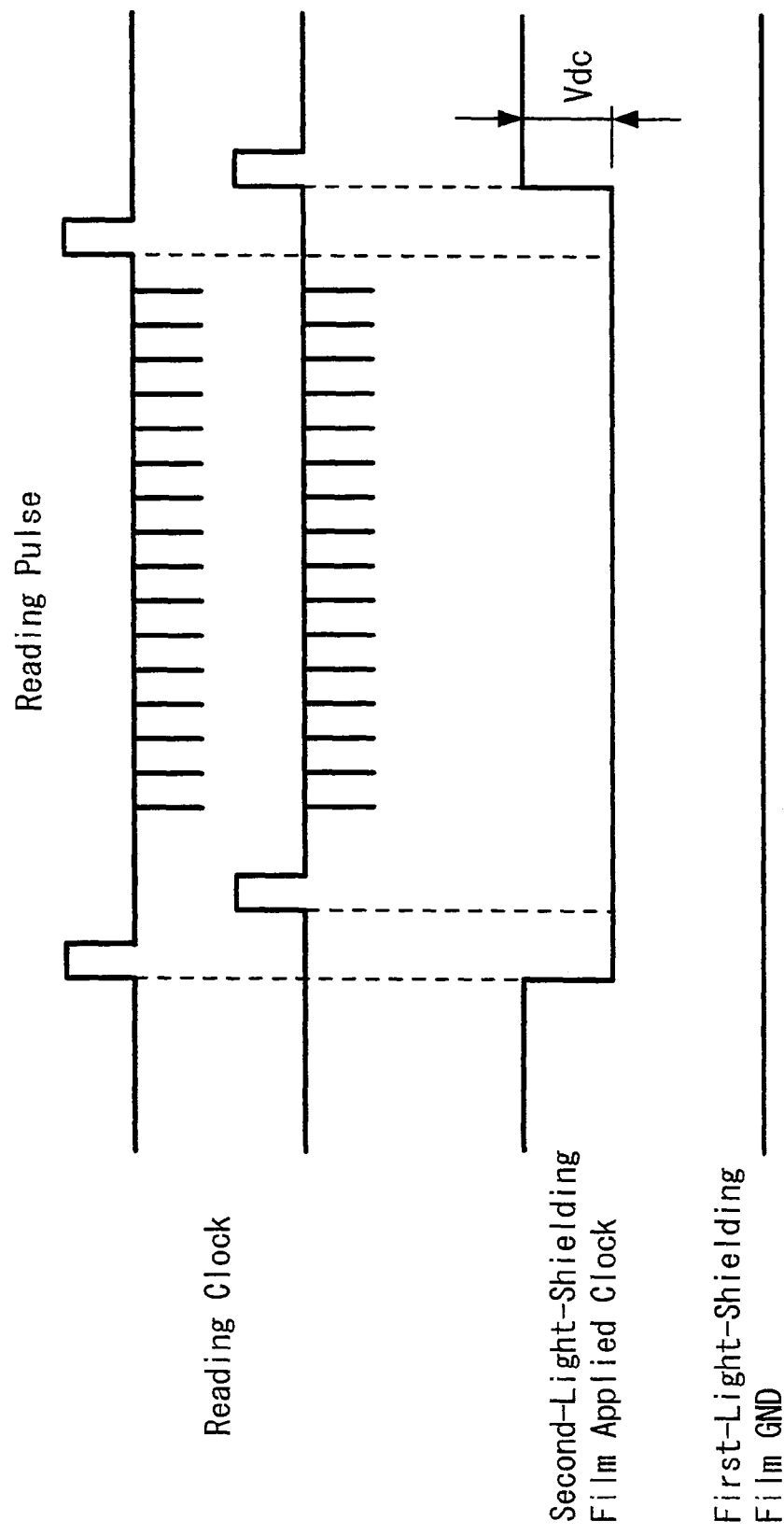

Vertical Transfer Register    Vertical Transfer Register

Ion Implantation

Diagonal Ion Implantation

SOLID-STATE IMAGING DEVICE AND METHOD FOR MANUFACTURING THEREOF AS WELL AS DRIVING METHOD OF SOLID-STATE IMAGING DEVICE

RELATED APPLICATION DATA

This application is a divisional of U.S. patent application Ser. No. 10/548,182, filed Sep. 6, 2005, the entirety of which is incorporated herein by reference to the extent permitted by law. U.S. patent application Ser. No. 10/548,182 is the Section 371 National Stage of PCT/JP2004/002817. This application claims the benefit of priority to Japanese Patent Application Nos. 2003-060328, filed Mar. 6, 2003 and 2003-094120, filed Mar. 31, 2003.

TECHNICAL FIELD

The present invention relates to a solid-state imaging device and a method for manufacturing thereof as well as a driving method of the solid-state imaging device. Particularly, the present invention relates to a solid-state imaging device having a light-shielding film and a method for manufacturing thereof as well as a driving method of the solid-state imaging device.

BACKGROUND ART

In a CCD solid-state imaging device, CMOS-type solid-state imaging device and the like, what is called a HAD (Hole Accumulated Diode) sensor is employed, that is a structure in which a positive charge accumulated area containing P-type high impurity concentration ($P^+$) is formed on the surface of a light-receiving sensor portion where an N-type impurity area is formed.

FIG. 16 shows a schematic sectional view of a conventional CCD solid-state imaging device employing this HAD sensor.

The CCD solid-state imaging device includes, on a semiconductor substrate 151 such as a silicon substrate, an N-type semiconductor area 152 forming a photoelectric conversion area, a P-type channel stop area (pixel-separation area) 153, a P-type semiconductor well area 154, an N-type transfer channel area 155, and a P-type reading gate 162; further, on the surface of the N-type semiconductor area 152 forming the photoelectric conversion area is formed a $P^+$ (P-type high impurity concentration) positive charge accumulated area (Hole Accumulated Layer) 156. These N-type semiconductor area 152 and positive charge accumulated area (Hole Accumulated Layer) 156 forms a light-receiving sensor portion 161.

On the semiconductor substrate 151 is formed a charge-transfer electrode 158 through a gate insulation film.

Further, a light-shielding film 159 is formed over the charge-transfer electrode 158 through an interlayer insulation film to cover the charge-transfer electrode 158, thereby preventing noise generated in a signal charge under transfer due to light incident on a vertical transfer register 163.

The light-shielding film 159 has an opening above the light-receiving sensor portion 161 so that light can be incident on the light-receiving sensor portion 161.

The P-type semiconductor well area 154, N-type transfer channel area 155, and charge-transfer electrode 158 above these areas form a vertical transfer register 163. The charge-transfer electrode 158 is formed ranging from the vertical transfer register 163 to the reading gate 162.

The vertical transfer register 163 is provided on one side of the light-receiving sensor portion 161 arranged in a vertical direction (the direction perpendicular to the surface of paper in FIG. 16), and has a belt-like plane shape. A horizontal transfer register, not shown, is connected to one end of the vertical transfer register 163.

Further, the channel stop area (pixel-separation area) 153 is formed between the light-receiving sensor portions 161 in the vertical direction, thereby causing the light-receiving sensor portion 161 of each pixel to be separated.

In this way, a plurality of light-receiving sensor portions 161 are arranged like a matrix and form the CCD solid-state imaging device (See, for example, Patent Literature 1 cited below)

In such solid-state imaging device, a single layer or a plurality of layers of the charge-transfer electrode 158 made of polycrystalline silicon or the like are usually formed on the reading gate 162 and vertical transfer register 163.

The potential of the reading gate 162 and the potential of the vertical transfer register 163 are controlled to read the signal charge from the light-receiving sensor portion 161 (particularly from the photoelectric conversion area 152 thereof) to the vertical transfer register 163 and to transfer the signal charge in the vertical transfer register 163.

On this occasion, the potential of the channel stop area (pixel-separation area) 153 is controlled so that the charge may not be read into adjacent pixels in a horizontal direction, that is, a lateral direction in the drawing.

The incident light is converted to the signal charge and is stored in the photoelectric conversion area (N-type semiconductor area) 152.

However, reduction in pixel size has been advanced in recent years, so that the solid-state imaging device may not make normal operation with the conventional structure of the impurity area.

Specifically, with the reduction of pixel size, the respective potentials of the channel stop area (pixel-separation area) 153, vertical transfer register 163, reading gate 162, and photoelectric conversion area (N-type semiconductor area) 152 are mutually affected by the two-dimensional modulation; thus, it has become difficult to maintain the blooming characteristic, readout characteristic, pixel-separation characteristic, and noise characteristic on the same level as before.

If the width of the reading gate 162 becomes narrower for example, the potential of the reading gate 162 is affected by the vertical transfer register 163 and photoelectric conversion area 152 to make the potential of reading gate 162 lower. This causes deterioration of the blooming characteristic. When the potential of the photoelectric conversion area 152 is made deeper to prevent this point, a voltage for reading must be made high, and therefore a charge-readout characteristic will deteriorate.

Further, if the channel stop area (pixel-separation area) 153 is made narrower for example, similarly to the potential of the reading gate 162, the potential thereof is affected by the two-dimensional modulation and becomes lower with the result that the pixel-separation characteristic will deteriorate.

Furthermore, because it becomes difficult to maintain a characteristic on the amount of saturated signal with reduction in the size of photoelectric conversion area 152, the photoelectric conversion area 152 must be made shallower; in that case, the potential of the positive charge accumulated area (Hole Accumulated Layer) 156 on the surface of the photoelectric conversion area 152 becomes lower, which makes lower the probability of trapping electron, that is, a noise component against holes and so causes an increase of the noise component.

When the concentration of P-type impurity in the positive charge accumulated area (Hole Accumulated Layer) 156 is increased to prevent this point, the potential of the adjacent reading gate 162 goes high to deteriorate the readout characteristic. At the same time, the potential of the channel stop area (pixel-separation area) 153 also goes high and an electric field between the channel stop area (pixel-separation area) 153 and vertical transfer register 163 is intensified at the time of reading charge, assumedly making the noise component increase due to avalanche breakdown and the like.

To cope with the above-described problems, the following method has been devised; the depth of each potential of the channel stop area (pixel-separation area) 153, reading gate 162, and positive charge accumulated area (Hole Accumulated Layer) 156 is made variable, for example, by applying a predetermined voltage signal to the light-shielding film 159, and for example, when the blooming characteristic, pixel-separation characteristic, and noise characteristic deteriorate, a minus voltage signal is applied to the light-shielding film 159, and when the readout characteristic deteriorates, a plus voltage signal is applied to the light-shielding film 159, thereby allowing the blooming characteristic, readout characteristic, pixel-separation characteristic, and noise characteristic to be secured satisfactorily (See, for example, Patent Literature 2 cited below).

(Patent Literature 1)
Published Japanese Patent Application No. 2002-252342 (Paragraph No. [0021], FIG. 3)
(Patent Literature 2)
Published Japanese Patent Application No. 2002-51267

Further, in an IT (interline)-type solid-state imaging device, for the purpose of restricting smears, a metal light-shielding film made of aluminum or the like is formed over the whole surface except the opening of photoelectric conversion area (See, for example, Patent Literature 3 cited below). That light-shielding film is usually connected to the ground (GND).

(Patent Literature 3)
Published Japanese Patent Application No. 2001-345437 (pp. 3-4, FIG. 1)

However, in the CCD solid-state imaging device shown in FIG. 16, when it is designed that a voltage signal is applied to the light-shielding film 159, it may be difficult to satisfy both of the noise characteristic and readout characteristic, depending on a design condition of each part (width, depth, impurity concentration, and the like).

This is because the light-shielding film 159 is formed projecting above the P+ positive charge accumulated area (Hole Accumulated Layer) 156 on the surface of the light-receiving sensor portion 161 in order to prevent the incidence of light on the vertical transfer register 163 as described above.

With this, for example, in the case where the potential of the positive charge accumulated area (Hole Accumulated Layer) 156 is raised by applying a minus voltage signal to the light-shielding film 159 to enhance the probability of trapping electron, that is, the noise component against holes and thereby improves the noise characteristic, an intense electric field is generated between the N-type transfer channel area 155 and P+ positive charge accumulated area (Hole Accumulated Layer) 156 on the side of the channel stop area (pixel-separation area) 153, or between the N-type semiconductor area 152 and P+ positive charge accumulated area (Hole Accumulated Layer) 156; thus, there may occur a lot of noise components due to avalanche breakdown or the like, which makes obtaining a sufficient noise characteristic difficult.

On the other hand, also on the side of reading gate 162, there is a possibility that the potential of the reading gate 162 is raised by applying the minus voltage signal to the light-shielding film 159, which makes the reading voltage increase to cause a readout characteristic to be obtained insufficiently.

Further, if P-type impurity concentration contained in the positive charge accumulated area (Hole Accumulated Layer) 156 is reduced for example, then the readout characteristic improves, but the noise characteristic deteriorates.

Furthermore, if a unit pixel size of the solid-state imaging device is reduced, when a P+ layer of the positive charge accumulated area (Hole Accumulated Layer) is formed, the P+ layer will diffuse under a reading electrode and a transfer electrode forming the sensor opening, being affected by an ion-implantation method, heat-treatment method and the like. This makes a unfavorable effect on a sensor characteristic.

For example, as shown in FIG. 28, when a P+ layer 216 of a sensor portion 214 diffuses under an electrode 212 (toward a reading gate 221 under an electrode 212R), the reading voltage rises and a dynamic margin to a driving voltage decreases. Further, when the P+ layer 216 diffuses under an electrode 212 (transfer electrode 212T) of the vertical register on the side of an adjacent pixel in a horizontal direction, an effective area of the vertical register 231 is reduced and the amount of electric charge handled by the vertical register 231 decreases.

To cope with this point, in the case where ion implantation when forming the P+ layer 216 is performed such that P-type impurities are ion-implanted using a mask or the like so as to keep away from the end of the opening of the sensor portion 214, the pinning on the surface of the sensor portion 214 is weakened and a dark current increases, and therefore a defect when there is no incident light (a so-called white noise) increases. Therefore, it is desired that the P+ layer 216 is formed not to go under the electrode 212 made of the reading electrode and transfer electrode, but to be adjacent to the end of the electrode 212; however, practically it is difficult because P-type impurities are diffusive.

In order to overcome the above-described problems, the present invention provides a solid-state imaging device having a sufficient noise characteristic and readout characteristic by improving the noise characteristic and readout characteristic in a well-balanced manner, as well as a method of manufacturing the same.

Further, the present invention provides a solid-state imaging device of high quality and a driving method thereof, as well as a method for manufacturing thereof, capable of enhancing the pinning of the sensor portion to reduce a dark current and decrease the white noise at a dark time.

DISCLOSURE OF INVENTION

A solid-state imaging device according to the present invention includes: on one side of a light-receiving sensor portion constituting a pixel, an electrode provided for reading a signal charge from the light-receiving sensor portion; a light-shielding film formed to cover an image pickup area except the light-receiving sensor portion, to which a predetermined voltage signal is applied; a second-conductivity-type semiconductor area formed in the center on the surface of a first-conductivity-type semiconductor area forming a photoelectric conversion area of the light-receiving sensor portion; and an area containing a lower impurity concentration than that of the second-conductivity-type semiconductor area formed at the end on the side of the electrode and at the opposite end on the side of a pixel-separation area on the surface of the first-conductivity-type semiconductor area.

A solid-state imaging device according to the present invention includes: a first electrode for reading a signal charge from a light-receiving sensor portion constituting a pixel or transferring that read signal charge arranged on one side of the light-receiving sensor portion; another electrode electrically independent from the first electrode provided on the side of the light-receiving sensor portion of the electrode, to which a predetermined voltage signal is applied; a second-conductivity-type semiconductor area formed in the center on the surface of the first-conductivity-type semiconductor area forming a photoelectric conversion area of the light-receiving sensor portion; and an area containing a lower impurity concentration than that of the second-conductivity-type semiconductor area formed at the end on the side of the first electrode and at the opposite end on the side of a pixel-separation area on the surface of the first-conductivity-type semiconductor area.

A solid-state imaging device according to the present invention includes: a photoelectric conversion portion for generating electric charge in accordance with the received light amount and a charge accumulated portion for receiving an electric charge read out from the photoelectric conversion portion by a reading electrode, in which the photoelectric conversion portion includes a first impurity area of a first-conductivity-type and a second impurity area of a second-conductivity-type formed on the first impurity area, and a third impurity area and fourth impurity area containing a lower concentration than that of the second impurity area, formed between the second impurity area and the charge accumulated portion.

A method of manufacturing a solid-state imaging device according to the present invention is a method of manufacturing the solid-state imaging device including the steps of: on one side of a light-receiving sensor portion, providing an electrode provided for reading a signal charge from the light-receiving sensor portion constituting a pixel, forming a light-shielding film to cover an image pickup area except the light-receiving sensor portion, to which a predetermined voltage signal is applied to the light-shielding film, and forming a second-conductivity-type semiconductor area in the center on the surface of a first-conductivity-type semiconductor area forming a photoelectric conversion area of the light-receiving sensor portion; in which after the first-conductivity-type semiconductor area is formed, the second-conductivity-type semiconductor area is formed in the center on the surface of the first-conductivity-type semiconductor area and then an area containing a lower impurity concentration than that of the second-conductivity-type semiconductor area is formed at the end on the side of the electrode and at the opposite end on the side of a pixel-separation area on the surface of the first-conductivity-type semiconductor area, respectively.

A solid-state imaging device according to the present invention, which transfers an electric signal obtained by photoelectric conversion in the sensor portion through a charge-coupled device, includes a light-shielding film that has an opening above the sensor portion, covers a non-photoelectric-conversion portion on the side of the sensor portion, and is connected to a DC supply source or a pulse supply source.

A method of driving a solid-state imaging device according to the present invention is a method for driving the solid-state imaging device which transfers an electric signal obtained by photoelectric conversion in the sensor portion through a charge-coupled device and which includes the light-shielding film that has an opening above the sensor portion and covers the whole surface of the non-photoelectric-conversion area; in which a DC voltage is applied to the light-shielding film at the time of reading the solid-state imaging device, or a pulse voltage is applied to the light-shielding film at the time of reading the solid-state imaging device.

A solid-state imaging device according to the present invention which transfers an electric signal obtained by photoelectric conversion in the sensor portion through a charge-coupled devices, includes a light-shielding film that has an opening above the sensor portion and covers non-photoelectric-conversion area on the side of the sensor portion, in which the light-shielding film is connected to a DC supply source and the sensor portion has an offset area provided between a reading electrode and a transfer electrode of an adjacent pixel in the solid-state imaging device. Alternatively, the light-shielding film is connected to a pulse supply source and the sensor portion has the offset area provided between the reading electrode and the transfer electrode of an adjacent pixel in the solid-state imaging device.

A method of manufacturing a solid-state imaging device according to the present invention is a method for manufacturing the solid-state imaging device which transfers an electric signal obtained by photoelectric conversion in the sensor portion through a charge-coupled device and includes a light-shielding film that has an opening above the sensor portion, covers non-photoelectric conversion area on the side of the sensor portion in the solid-state imaging device, and is connected to a DC supply source or a pulse supply source; in which a process of forming the sensor portion comprises the steps of: forming an n-type diffusion layer between a reading gate and a channel stop layer of the charge-coupled device of an adjacent pixel, and forming a p-type diffusion layer on the n-type diffusion layer by an ion-implantation method with the n-type diffusion layer on the side of the reading gate and on the side of the channel stop layer of an adjacent pixel being made into offset areas.

BRIEF DESCRIPTION OF DRAWINGS

FIGS. 2A and 2B are process diagrams for explaining a method of manufacturing the solid-state imaging device in FIG. 1.

FIG. 17A is a schematic structure section of a relevant part of the solid-state imaging device.

FIG. 17B is a structure diagram of a relevant part of the solid-state imaging device.

FIG. 19A is a schematic structure section of a relevant part of the solid-state imaging device; FIG. 19B is a structure diagram of a relevant part of the solid-state imaging device.

FIG. 20 is a diagram showing a relation between a reading pulse of a reading clock and a pulse voltage Vp of a clock applied to a light-shielding film.

FIG. 21A is a layout diagram of a relevant part of the solid-state imaging device; FIG. 21B is a structure diagram of a relevant part of the solid-state imaging device;

FIG. 22 is a diagram showing a relation between a reading pulse of a reading clock and a DC voltage Vdc of a clock applied to a light-shielding film.

FIG. 23A is a layout diagram of a relevant part of the solid-state imaging device.

FIG. 23B is a structure diagram of a relevant part of the solid-state imaging device.

BEST MODE FOR CARRYING OUT THE INVENTION

Figure 1:
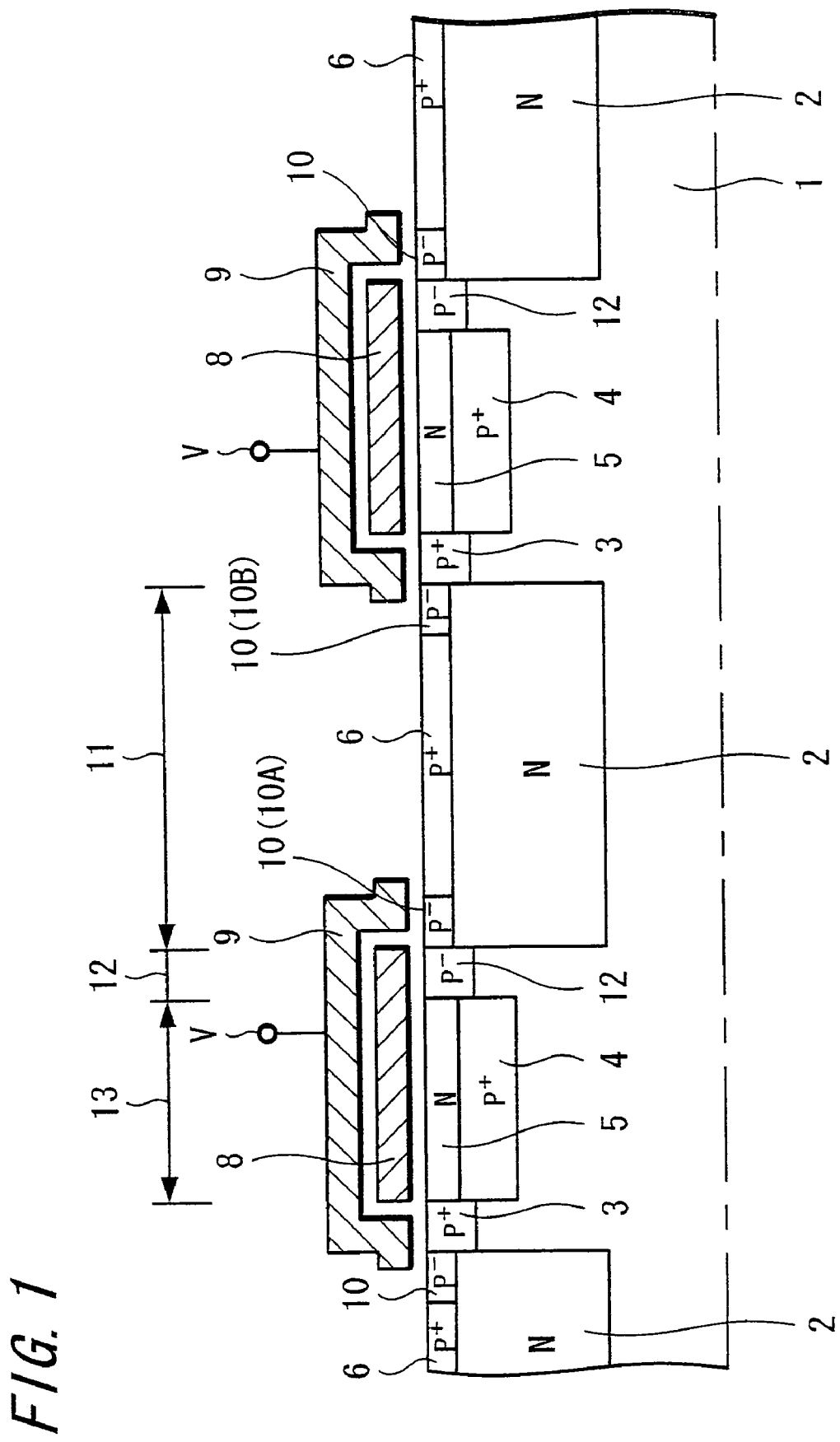
FIG. 1 is a schematic structure diagram (section) of a solid-state imaging device according to an embodiment of the present invention.

The present invention is a solid-state imaging device, in which an electrode for reading signal charge from a light-receiving sensor portion constituting a pixel is provided on one side of the light-receiving sensor portion, a light-shielding film is formed to cover an image pickup area except the light-receiving sensor portion, to which a predetermined voltage signal is applied on, a second-conductivity-type semiconductor area is formed in the center on the surface of a first-conductivity-type semiconductor area forming a photoelectric conversion area of the light-receiving sensor portion, and an area containing a lower impurity concentration than that of the second-conductivity-type semiconductor area is formed at the end on the side of the electrode and at the opposite end on the side of a pixel-separation area on the surface of the first-conductivity-type semiconductor area.

Further, the present invention has such a structure, in the above solid-state imaging device, that either a DC bias or a clock pulse, or both of them are applied as the voltage signal.

Further, the present invention has such a structure, in the above solid-state imaging device, that a charge-transfer portion for transferring the read signal charge is provided on one side of the light-receiving sensor portion and the electrode also serves as a charge-transfer electrode in the charge-transfer portion.

Further, the present invention has such a structure, in the above solid-state imaging device, that the second-conductivity-type semiconductor area is formed to be self-aligned with an opening of the light-shielding film above the light-receiving sensor portion.

According to the above-described solid-state imaging device of the present invention, because a predetermined voltage signal is applied to the light-shielding film, an auxiliary electric field is generated by the light-shielding film to reduce the effect of two-dimensional modulation caused by the light-receiving sensor portion, which makes the potential of each part variable and makes the potential corrected by applying the voltage signal.

Further, because, on the surface of the first-conductivity-type semiconductor area forming a photoelectric conversion area of the light-receiving sensor portion, an area containing a lower impurity concentration than that of the second-conductivity-type semiconductor area in the center is formed at the end on the side of the electrode and at the opposite end on the side of a pixel-separation area, a depth of the potential at the end of the surface of the light-receiving sensor portion can be corrected; and therefore, the reading voltage can be reduced on the side of the electrode, and also noise generation due to avalanche breakdown or the like can be suppressed by weakening the electric field on the side of pixel-separation area.

The present invention is a solid-state imaging device in which a first electrode for reading signal charge from a light-receiving sensor portion or transferring the read signal charge is arranged on one side of the light-receiving sensor portion constituting a pixel, another electrode that is electrically independent from the first electrode is provided, to which a predetermined voltage signal is applied, a second-conductivity-type semiconductor area is formed in the center on the surface of a first-conductivity-type semiconductor area forming a photoelectric conversion area of the light-receiving sensor portion, and an area containing a lower impurity concentration than that of the second-conductivity-type semiconductor at the end on the side of the first electrode and at the opposite end on the side of a pixel-separation area on the surface of the first-conductivity-type semiconductor area.

Further, the present invention has such a structure, in the above solid-state imaging device, that either a DC bias or a clock pulse, or both of them are applied as the voltage signal.

Furthermore, the present invention has such a structure, in the above solid-state imaging device, that a charge-transfer portion for transferring the read signal charge is provided on one side of the light-receiving sensor portion and the first electrode is a charge-transfer electrode in the charge-transfer portion.

Further, the present invention has such a structure, in the above solid-state imaging device, that the second-conductivity-type semiconductor area in the light-receiving sensor portion is formed to be self-aligned with an edge of another electrode.

According to the above-described solid-state imaging device of the present invention, because a predetermined voltage signal is applied to the another electrode provided on the side of the light-receiving sensor portion in the first electrode, the another electrode is made to generate an auxiliary electric field between the first electrode and the light-receiving sensor portion to reduce the effect of two-dimensional modulation caused by the light-receiving sensor portion; and therefore the potential of each part can be made variable and the potential can be corrected by applying the voltage signal.

Moreover, because, on the surface of the first-conductivity-type semiconductor area forming the photoelectric conversion area of the light-receiving sensor portion, an area containing a lower impurity concentration than that of the second-conductivity-type semiconductor area in the center is formed at the end on the side of the electrode and at the opposite end on the side of a pixel-separation area, a depth of the potential at the end of the surface of the light-receiving sensor portion can be corrected; thus, the reading voltage can be reduced on the side of the electrode and also noise generation due to avalanche breakdown or the like can be suppressed by weakening the electric field on the side of the pixel-separation area.

The present invention is a solid-state imaging device including a photoelectric conversion portion for generating charge in accordance with the amount of received light and a charge accumulated portion for receiving charge read by a reading electrode from the photoelectric conversion portion are provided, in which the photoelectric conversion portion includes a first impurity area of a first-conductivity-type and a second impurity area of a second-conductivity-type formed on the first impurity area, and third impurity area and fourth impurity area of the second-conductivity-type containing a lower concentration than that of the second impurity area are formed between the second impurity area and the charge accumulated portion.

Moreover, the present invention has such a structure, in the above solid-state imaging device, that a voltage applying portion is formed separately from the reading electrode, the third impurity area is formed adjacently to the second impurity area, and the voltage applying portion applies a voltage at least to the third impurity area for controlling the potential of the third impurity area.

According to the above-described solid-state imaging device of the present invention, because third impurity area and fourth impurity area of the second-conductivity-type containing a lower concentration than that of the second impurity area are formed between the second impurity area and the charge accumulated portion on the photoelectric conversion portion, a depth of the potential at the end of an upper part of the photoelectric conversion portion can be corrected; and therefore the reading voltage can be reduced.

The present invention is a method of manufacturing a solid-state imaging device in which an electrode for reading signal charge from a light-receiving sensor portion is provided on one side of the light-receiving sensor portion constituting a pixel, a light-shielding film is formed to cover an image pickup area except the light-receiving sensor portion, to which a predetermined voltage signal is applied, and a second-conductivity-type semiconductor area is formed in the center on the surface of a first-conductivity-type semiconductor area forming a photoelectric conversion area of the light-receiving sensor portion, wherein after the first-conductivity-type semiconductor area is formed, the second-conductivity-type semiconductor area is formed in the center on the surface of the first-conductivity-type semiconductor area, and an area containing a lower impurity concentration than that of the second-conductivity-type semiconductor area is formed at the end on the side of the electrode and at the opposite end on the side of a pixel-separation area on the surface of the first-conductivity-type semiconductor area.

Moreover, the present invention is such that, in a method of manufacturing the above solid-state imaging device, when forming the second-conductivity-type semiconductor area and the area containing a lower impurity concentration than that of the second-conductivity-type semiconductor area, respectively, the ion implantation is performed separately toward the end on the side of the electrode and toward the opposite end on the side of the pixel-separation area.

Further, in the present invention, in a method of manufacturing the above solid-state imaging device, the light-shielding film is formed after the first-conductivity-type semiconductor area is formed, an opening is formed in the light-shielding film above the light-receiving sensor portion, and the second-conductivity-type semiconductor area is formed by ion implantation using the light-shielding film as a mask.

According to the above-described method of manufacturing the solid-state imaging device of the present invention, when manufacturing the solid-state imaging device in which a predetermined voltage signal is applied to the light-shielding film, the potential of each part is made variable as described above to correct the potential by applying the voltage signal, by forming the second-conductivity-type semiconductor area in the center on the surface of the first-conductivity-type semiconductor area after the first-conductivity-type semiconductor area is formed, and by forming the area containing a lower impurity concentration than that of the second-conductivity-type semiconductor area at the end on the side of the electrode and at the opposite end on the side of the pixel-separation area on the surface of the first-conductivity-type semiconductor area, respectively, such solid-state imaging device can be manufactured that a depth of the potential at the end of the surface of the light-receiving sensor portion can be corrected as described above, the reading voltage is reduced on the side of the electrode, and noise generation due to avalanche breakdown or the like can be suppressed by weakening the electric field on the side of the pixel-separation area.

The present invention is a solid-state imaging device that transfers an electric signal obtained by photoelectric conversion in a sensor portion through a charge-coupled device and includes a light-shielding film having an opening above the sensor portion, to cover a non-photoelectric-conversion area on the side of the sensor portion, wherein the light-shielding film is connected to a DC supply source.

Moreover, the present invention has such a structure, in the above solid-state imaging device, that the light-shielding film is formed of a plurality of layers, in which a first light-shielding film in the plurality of layers has an opening above the sensor portion and covers the non-photoelectric conversion area on the side of the sensor portion, and is grounded, and a second light-shielding film in the plurality of layers is formed on a light-shielding film under the second light-shielding film through an insulating film, projects from one side of the opening in the first light-shielding film to the sensor portion, and is connected to a DC supply source.

According to the above-described solid-state imaging device of the present invention, the noise generation can be suppressed by applying a voltage to the light-shielding film. Furthermore, because the light-shielding film is connected to the DC supply source, the pinning on the surface of the sensor portion is enhanced. Moreover, by applying a minus voltage at the time of charge transfer, the potential barrier of reading gate can be set high and the blooming characteristic can be improved.

The present invention is a solid-state imaging device that transfers an electric signal obtained by photoelectric conversion in the sensor portion through charge-coupled devices, and includes a light-shielding film that has an opening above the sensor portion and covers non-photoelectric conversion area on the side of the sensor portion, wherein the light-shielding film is connected to a pulse supply source.

Moreover, the present invention has such a structure, in the above solid-state imaging device, that the light-shielding film is formed of a plurality of layers, in which a first light-shielding film in the plurality of layers has the opening above the sensor portion, covers the non-photoelectric conversion area on the side of sensor portion and is grounded, and a second light-shielding film in the plurality of layers is formed on a light-shielding film under the second light-shielding film through an insulating film, projects from one side of the opening in the first light-shielding film to the sensor portion, and is connected to a pulse supply source.

In addition, the present invention has such a structure, in the above solid-state imaging device, that the second light-shielding film is formed on the side of a reading electrode.

According to the above-described solid-state imaging device of the present invention, the noise generation can be suppressed by applying a voltage to the light-shielding film. Also, because the light-shielding film is connected to the pulse supply source, a pulse synchronized with the reading pulse can be applied to the light-shielding film so as to assist reading and to reduce the reading voltage.

The present invention is a method of driving a solid-state imaging device that transfers an electric signal obtained by photoelectric conversion in the sensor portion through a charge-coupled device and includes a light-shielding film having an opening above the sensor portion and covering a non-photoelectric-conversion area on the side of the sensor portion, wherein a DC voltage is applied to the light-shielding film at the time of reading the solid-state imaging device.

Moreover, in the present invention, in the method of driving the solid-state imaging device, the light-shielding film is formed of a plurality of layers, in which a first light-shielding film in the plurality of layers has an opening above the sensor portion, covers the non-photoelectric-conversion area on the side of the sensor portion and is grounded, a second light-shielding film in the plurality of layers is formed on a light-shielding film under the second light-shielding film through an insulating film, projects from one side of the opening in the first light-shielding film to the sensor portion, and the DC voltage is applied to the second light-shielding film.

According to the above-described method of driving the solid-state imaging device of the present invention, the noise generation can be suppressed by applying a voltage to the light-shielding film. Furthermore, because the DC voltage is applied to the light-shielding film at the time of reading the solid-state imaging device, the pinning on the surface of the sensor portion is enhanced. In addition, by applying a minus voltage at the time of charge transfer, of the potential barrier of a reading gate can be set high and the blooming characteristic can be improved.

The present invention is a method of driving a solid-state imaging device that transfers an electric signal obtained by photoelectric conversion in a sensor portion through charge-coupled device and includes a light-shielding film having an opening above the sensor portion and covering non-photo-electric-conversion area on the side of the sensor portion, wherein a pulse voltage is applied to the light-shielding film at the time of reading the solid-state imaging device.

Moreover, in the present invention, in the method of driving the solid-state imaging device, the light-shielding film is formed of a plurality of layers, in which a first light-shielding film in the plurality of layers has an opening above the sensor portion, covers the non-photoelectric-conversion area on the side of the sensor portion, and is grounded, and a second light-shielding film in the plurality of layers is formed on a light-shielding film under the second light-shielding film through an insulating film, projects from one side of the opening in the first light-shielding film to the sensor portion, and the pulse voltage is applied on the second light-shielding film.

In addition, the present invention has such a structure, in the method of driving the solid-state imaging device, that the second light-shielding film is formed on the side of a reading electrode.

According to the above-described method of driving the solid-state imaging device, the noise generation can be suppressed by applying a voltage to the light-shielding film. Furthermore, by applying the pulse voltage to the light-shielding film at the time of reading the solid-state imaging device, reading can be assisted and the reading voltage can be reduced.

The present invention is a solid-state imaging device that transfers an electric signal obtained by photoelectric conversion in the sensor portion through a charge-coupled device and includes a light-shielding film having an opening above a sensor portion and covering the non-photoelectric-conversion area on the side of the sensor portion, wherein the light-shielding film is connected to a DC supply source and the sensor portion has an offset area provided between a reading gate and a channel stop layer of an adjacent pixel in the solid-state imaging device.

Moreover, the present invention has such a structure, in the above solid-state imaging device, that the light-shielding film is formed of a plurality of layers, in which a first light-shielding film in the plurality of layers has an opening above the sensor portion, covers the non-photoelectric-conversion area on the side of the sensor portion, and is grounded, and a second light-shielding film in the plurality of layers is formed on a light-shielding film under the second light-shielding film through an insulating film, projects from one side of the opening in the first light-shielding film, and is connected to a DC supply source.

According to the above-described solid-state imaging device, because the sensor portion has the offset area between a reading gate and a channel stop layer of an adjacent pixel in the solid-state imaging device, a p-type layer of the sensor portion will not diffuse toward the reading gate; thus, the reading voltage can be suppressed low and a dynamic margin to a driving voltage will be made broadened. Also, because the p-type layer will not diffuse under a transfer electrode (toward the channel stop layer) of a vertical register on the side of an adjacent pixel in a horizontal direction, an effective area of the vertical register will be secured and the amount of electric charge handled by the vertical register will be secured. Further, the noise generation can be suppressed by applying the voltage to the light-shielding film. Furthermore, because the light-shielding film is connected to the DC supply source, the pinning on the surface of the sensor portion can be enhanced. In addition, by applying a minus voltage at the time of charge transfer, the potential barrier of the reading gate can be set high and the blooming characteristic can be improved.

The present invention is a solid-state imaging device that transfers an electric signal obtained by photoelectric conversion in the sensor portion and includes a light-shielding film that having an opening above the sensor portion and covering the non-photoelectric-conversion area on the side of the sensor portion, wherein the light-shielding film is connected to a pulse supply source and the sensor portion has an offset area between a reading gate and a channel stop layer of an adjacent pixel in the solid-state imaging device.

Moreover, the present invention has such a structure, in the above solid-state imaging device, that the light-shielding film is formed of a plurality of layers, in which a first light-shielding film in the plurality of layers has an opening above the sensor portion, covers the non-photoelectric-conversion area on the side of the sensor portion, and is grounded, and a second light-shielding film in the plurality of layers is formed on a light-shielding film under the second light-shielding film through an insulating film, projects from one side of an opening in the first light-shielding film to the sensor portion, and is connected to a pulse supply source.

Also, the present invention has such a structure, in the above solid-state imaging device, that the second light-shielding film is formed on the side of a reading electrode.

According to the above-described solid-state imaging device of the present invention, because the sensor portion has an offset area between the reading gate and the channel stop layer of an adjacent pixel in the solid-state imaging device, the p-type layer of the sensor portion will not diffuse toward the reading gate; thus, the reading voltage can be suppressed low and a dynamic margin to a driving voltage will be broadened. Moreover, because the p-type layer will not diffuse under a transfer electrode (toward the channel stop layer) of a vertical register on the side of an adjacent pixel in a horizontal direction, an effective area of the vertical register is secured and the amount of electric charge handled by the vertical register is ensured. In addition, it is possible to suppress the noise generation by applying a voltage to the light-shielding film. Further, because the light-shielding film is connected to a pulse supply source, a pulse synchronized with a reading pulse can be applied to the light-shielding film, which will assist reading and reduce the reading voltage.

The present invention is a method of manufacturing a solid-state imaging device that transfers an electric signal obtained by photoelectric conversion in a sensor portion and includes a light-shielding film having an opening above the sensor portion, covering a non-photoelectric-conversion area on the side of the sensor portion, and being connected to a DC supply source, wherein a process of forming the sensor portion includes the steps of: forming a n-type diffusion layer between a reading gate and a channel stop layer of a charge-coupled device of an adjacent pixel, and forming a p-type diffusion layer on the n-type diffusion layer by an ion-implantation method making offset areas of the n-type diffusion layer on the side of the reading gate and on the side of the channel stop layer of an adjacent pixel.

Moreover, in the present invention, in the method of manufacturing the solid-state imaging device, the light-shielding film is formed such that, after a first light-shielding film covering a non-photoelectric-conversion area on the side of the sensor portion has been formed through an insulating film, an opening is formed in the first light-shielding film above the sensor portion and then a second light-shielding film projecting from one side of the opening in the first light-shielding film to the sensor portion is formed on the first light-shielding film through an insulating film.

According to the method of manufacturing the solid-state imaging device of the present invention, because a p-type diffusion layer is formed on an n-type diffusion layer by an ion-implantation method making the offset areas of the n-type diffusion layer on the side of the reading gate and on the side of the channel stop layer of an adjacent pixel, the p-type diffusion layer is formed in a state separated away from the reading gate and the channel stop layer of an adjacent pixel by the offset area, respectively. For this reason, the p-type layer of the sensor will not diffuse toward the reading gate and so the reading voltage can be suppressed low and a dynamic margin to a driving voltage is broadened. Further, because the p-type layer will not diffuse under the transfer electrode (toward the channel stop layer) of a vertical register on the side of an adjacent pixel in a horizontal direction, an effective area of the vertical register can be secured and the amount of electric charge handled by the vertical register will be ensured. Further, the noise generation can be suppressed by applying a voltage to the light-shielding film. In addition, because the light-shielding film is connected to a DC supply source, the pinning on the surface of sensor portion is enhanced. Further, by applying a minus voltage at the time of charge transfer, the potential barrier of the reading gate can be set high and the blooming characteristic can be improved.

The present invention is a method of manufacturing a solid-state imaging device that transfers an electric signal obtained by photoelectric conversion in a sensor portion and includes a light-shielding film having an opening above the sensor portion, covering a non-photoelectric-conversion area, and being connected to a pulse supply source, wherein a process of forming the sensor portion includes the steps of: forming an n-type diffusion layer between a reading gate and a channel stop layer of a charge-coupled device of an adjacent pixel, and forming a P-type diffusion layer on the n-type diffusion layer by an ion-implantation method making offset areas of the n-type diffusion layer on the side of the reading gate and on the side of the channel stop layer of adjacent pixel.

Moreover, in the present invention, in a method of manufacturing the above solid-state imaging device, the light-shielding film is formed such that after a first light-shielding film covering the non-photoelectric-conversion area on the side of the sensor portion through an insulation film has been formed, the opening is formed in the first light-shielding film above the sensor portion and then a second light-shielding film projecting from one side of the opening in the first light-shielding film to the sensor portion is formed on the first light-shielding film through an insulating film.

Further, in the present invention, in the method of manufacturing the above solid-state imaging device, the second light-shielding film is formed on the side of a reading electrode.

According to the above-described method of manufacturing the solid-state imaging device, because a p-type diffusion layer is formed on an n-type diffusion layer by an ion-implantation method making offset areas of the n-type diffusion layer on the side of a reading gate and on the side of a channel stop layer of an adjacent pixel, the p-type diffusion layer is formed in a state separated away from the reading gate and channel stop layer of the adjacent pixel by the offset area, respectively. For this reason, the p-type layer in the sensor portion will not diffuse toward the reading gate, so that a reading voltage can be suppressed low and a dynamic margin to a driving voltage will be broadened. Further, because the p-type layer will not diffuse under a transfer electrode (toward the channel stop layer) of a vertical register on the side of an adjacent pixel in a horizontal direction, an effective area of the vertical register is secured and the amount of electric charge handled by the vertical register is ensured. Further, the noise generation can be suppressed by applying a voltage on the light-shielding film. In addition, because the light-shielding film is connected to a pulse supply source, a pulse synchronized with a reading pulse can be applied to the light-shielding film, which will assist reading and reduce a reading voltage.

FIG. 1 shows a schematic structure diagram (section) of a solid-state imaging device as an embodiment according to the present invention. In this embodiment, the present invention is applied to a CCD solid-state imaging device.

This solid-state imaging device is formed as follows; on a semiconductor substrate 1 such as a silicon substrate are formed a first-conductivity-type semiconductor area, for example, N-type semiconductor area 2 forming a photoelectric conversion area, a second-conductivity-type, for example, P-type channel stop area (pixel-separation area) 3, P-type semiconductor well area 4, the first-conductivity-type, for example, N-type transfer channel area 5, and the second-conductivity-type, for example, P-type reading gate portion 12; further, on the surface of the N-type semiconductor area 2 forming the photoelectric conversion area is formed the second-conductivity-type, for example, P-type positive charge accumulated area (Hole Accumulated Layer). These N-type semiconductor area 2 and positive charge accumulated area (Hole Accumulated Layer) form a light-receiving sensor portion 11.

On the semiconductor substrate 1 is formed a charge-transfer electrode 8 through a gate insulation film. Further, above the charge-transfer electrode 8 is formed a light-shielding film 9 so as to cover the charge-transfer electrode 8 through an interlayer insulation film. The light-shielding film 9 prevents light from entering the transfer channel area 5 or the like and noise from being caused in a signal charge under transfer.

The light-shielding film 9 has an opening above the light-receiving sensor portion 11 so that light can enter the light-receiving sensor portion 11.

The P-type semiconductor well area 4, N-type transfer channel area 5, and charge-transfer electrode 8 above them form a vertical transfer register 13. The charge-transfer electrode 8 is formed over from the vertical transfer register 13 to a reading gate portion 12.

The vertical transfer register 13 is provided on one side of the light-receiving sensor portions 11 arranged in a vertical direction (a direction perpendicular to the surface of paper in FIG. 1) and has a plane shape like a belt. A horizontal transfer register is connected to one end of the vertical transfer register 13 though not shown.

Moreover, the channel stop area (pixel-separation area) 3 is similarly formed between the light-receiving sensor portions 11 arranged in a vertical direction, whereby the light-receiving sensor portion 11 of respective pixels is separated from each other.

In this way, a number of light-receiving sensor portions 11 are arranged like a matrix and form a solid-state imaging device.

If necessary, a color filter, an on-chip microlens, or the like is formed above the light-shielding film 9.

This embodiment is designed so that a voltage V can be applied to the light-shielding film 9.

As to the voltage V to be applied on the light-shielding film 9, a pulse voltage, a fixed bias voltage, or the like is considered, and a positive potential, a grounded potential, or a negative potential may be applied depending on a required characteristic.

Note that, although FIG. 1 schematically shows that the voltage V is applied to each light-shielding film 9, because each light-shielding film 9 is actually connected to each other, they need only be connected to the wiring in the periphery of an image pickup area.

Moreover, in the solid-state imaging device according to this embodiment, a positive charge accumulated area (Hole Accumulated Layer) on the surface forming the light-receiving sensor portion 11 is particularly made of a positive charge accumulated area (Hole Accumulated Layer) 6 containing a high impurity concentration ($P^+$) in the center and positive charge accumulated areas (Hole Accumulated Layers) 10 in the vicinity of the reading gate portion 12 and in the vicinity of the channel stop area (pixel-separation area) 3, each containing a low impurity concentration ($P^-$).

If P-type impurity concentration of the whole positive charge accumulated area is simply reduced, the readout characteristic improves, but the noise characteristic deteriorates as described above.

In contrast, by reducing P-type impurity concentration of the positive charge areas in the vicinity of the reading gate portion 12 and in the vicinity of the channel stop area (pixel-separation area) 3 to make a low impurity concentration ($P^-$) of the positive charge accumulated area 10, it is possible to improve the reading characteristic as well as the noise characteristic.

P-type impurity concentration of the positive accumulated area 10 (10A) in the vicinity of the reading gate portion 12 is reduced to the extent that an effect of reducing the reading voltage can be attained.

By doing so, the potential of the reading gate portion 12 becomes not to be affected easily by the positive charge accumulated areas 6, 10 (10A), and so the readout characteristic will be improved.

In addition, because the potential of the positive charge accumulated area 10 (10A) close to a surface is fixed by applying the voltage V to the light-shielding film 9, the noise characteristic will not deteriorate.

Further, by reducing P-type impurity concentration of the positive charge accumulated area in the vicinity of the channel stop area (pixel-separation area) 3 to make a low impurity concentration ($P^-$) of the positive charge accumulated area 10 (10B), an electric field from the channel stop area (pixel-separation area) 3 to the vertical transfer register 8 is weakened at the time of reading the signal charge and the generation of noise component due to avalanche breakdown and the like will be suppressed.

Note that, although there are also the charge-transfer electrode 8 and channel stop area (pixel-separation area) 3 between adjacent pixels in a vertical direction, not shown (forward position and backward position in FIG. 1), because these portions are not provided with a charge-transfer portion (vertical transfer register 13), the deterioration of characteristics due to a potential change affected by the two-dimensional modulation will not be large. For this reason, the positive charge accumulated area of low impurity concentration (Hole Accumulated Layer) 10 need not always be formed on the side of channel stop area (pixel-separation area) 3 between adjacent pixels in a vertical direction.

As described above, a fixed bias voltage or a pulse voltage can be used as the voltage V to be applied to the light-shielding film 9.

When a fixed bias voltage is employed as the voltage applied on the light-shielding film 9 in actuality, three patterns are available, namely, a case of always fixing at the ground potential (ground level), a case of always fixing at +potential (positive potential), and a case of always fixing at −potential (negative potential).

In the case of always fixing at the ground potential (ground level), when the positive charge accumulated areas 6, 10 are affected by a peripheral potential fluctuation for example, because the light-shielding film 9 is fixed at the ground potential, it is possible to suppress the effect of that potential fluctuation and to restrict the deterioration of noise.

In the case of always fixing at −potential, a further reduction of noise can be expected. In this case, while the deterioration of reading voltage due to the fact that the light-shielding film 9 is kept at −potential may occur, because P-type impurity concentration of the positive charge accumulated area 10 (10A) in the vicinity of the reading gate portion 12 is reduced as described above, the deterioration of reading voltage can be prevented. Furthermore, with respect to the noise from channel stop area (pixel-separation area) 3, because P-type impurity concentration of the positive charge accumulated area 10 (10B) in the vicinity of the channel stop area (pixel separation area) 3 is also reduced, the electric field is weakened and the noise generation is suppressed.

Further, in the case of always fixing at +potential, because P-type impurity concentration of the positive charge accumulated area 10 (10A) in the vicinity of the reading gate portion 12 is reduced, a further improvement of reading voltage is expected; however, because the deterioration of noise due to keeping the light-shielding film 9 at +potential is conceivable, P-type impurity concentration of the positive charge accumulated area 6 containing a high concentration in the center is made to increase inversely for preventing the deterioration of noise. Because the noise characteristic and readout characteristic are in a tradeoff relation with each other, P-type impurity concentration of the positive charge accumulated area 6 containing a high concentration is optimized in order to make both the characteristics satisfactory. There is a similar relation between the noise from the channel stop area (pixel-separation area) 3 and the readout characteristic.

Next, when a pulse voltage is applied as the voltage V actually applied to the light-shielding film 9, it is conceivable that, by employing a pattern of fixing at −potential or at ground potential when accumulating the charge and then changing that level toward +potential when reading the charge, both of the reading characteristic and noise characteristic will be improved.

On this occasion, although the potential of the positive charge accumulated areas 6, 10 vary, because the duration of the pulse is very short, it is assumed that the probability of generating noise owing to the above-described cause will be extremely low.

The solid-state imaging device according to this embodiment can be manufactured, for example, as follows.

On the semiconductor substrate 1 are formed an N-type semiconductor area 2, P-type semiconductor well area 4, N-type transfer channel area 5, P⁻ of reading gate portion 12, and P⁺ of channel stop area (pixel-separation area) 3, respectively.

Moreover, in the vicinity of the surface of the N-type semiconductor area 2 is formed a P-type positive charge accumulated area 10 of a low impurity concentration (P⁻).

Next, on the semiconductor substrate 1 is formed an electrode layer forming a charge-transfer electrode 8 through an insulating film; and this electrode layer is subjected to patterning to remain over the reading gate portion 12 and transfer channel area 5 to form the charge-transfer electrode 8 (See FIG. 2A).

Subsequently, a mask 21 such as a resist is employed to cover the P⁻ positive charge accumulated area 10 except the center on the surface of the N-type semiconductor area 2, and then the ion implantation 22 of P-type impurities is performed to make the center contain a high impurity concentration (P⁺) to form a P-type positive charge accumulated area (Hole Accumulated Layer) 6 containing a high impurity concentration (P⁺) in the center of the surface of N-type semiconductor area 2 (See FIG. 2B). On this occasion, because the surface of the N-type semiconductor area 2 (the end portion thereof) other than the center is covered with the mask 21, a low impurity concentration of the positive charge accumulated area 10 is left.

Next, the mask 21 is removed and an interlayer insulation film is formed, on which a light-shielding film 9 is formed.

Thereafter, if necessary, an insulation layer is formed above the light-shielding film 9 and after planarizing the surface, a color filter, an on-chip microlens and the like are formed.

In this way, the solid-state imaging device according to the embodiment shown in FIG. 1 can be manufactured.

Figure 3:
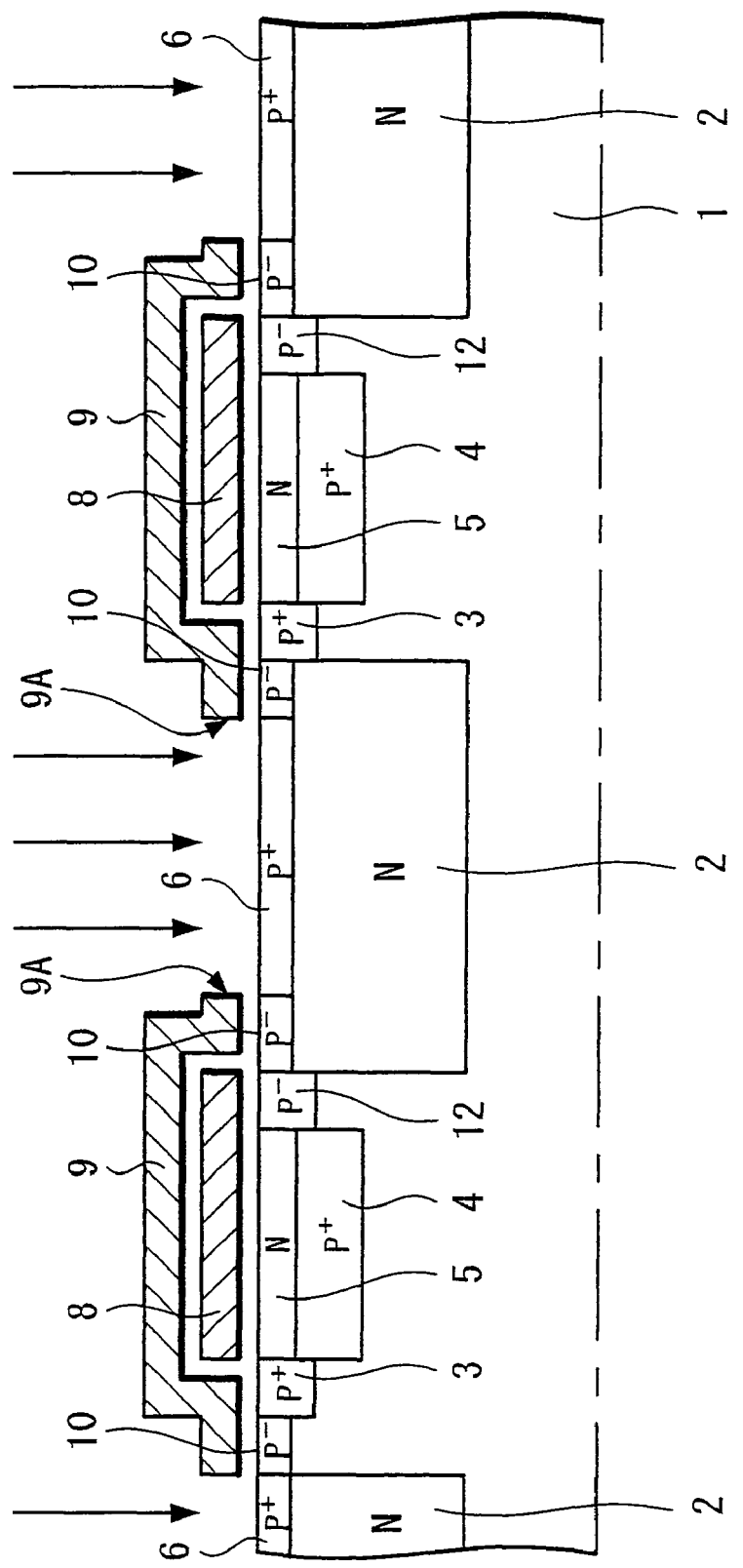
FIG. 3 is a diagram showing a method of forming the positive charge accumulated area to be self-aligned with the light-shielding film.

Note that, instead of forming the P-type positive charge accumulated area 6 containing a high impurity concentration (P⁺) by using the mask 21 as shown in FIG. 2B, the area may be formed, for example, by performing the ion implantation using the light-shielding film 9 as a mask after having formed the light-shielding film 9 as shown in FIG. 3. With that, the P-type positive charge accumulated area 6 containing a high impurity concentration (P⁺) can be formed to be self-aligned with an opening edge 9A of the light-shielding film 9.

In this case, the positive charge accumulated area 10 of a low impurity concentration (P⁻) will remain also on the side of a channel stop area (pixel-separation area) between adjacent pixels in a vertical direction.

Figure 4:
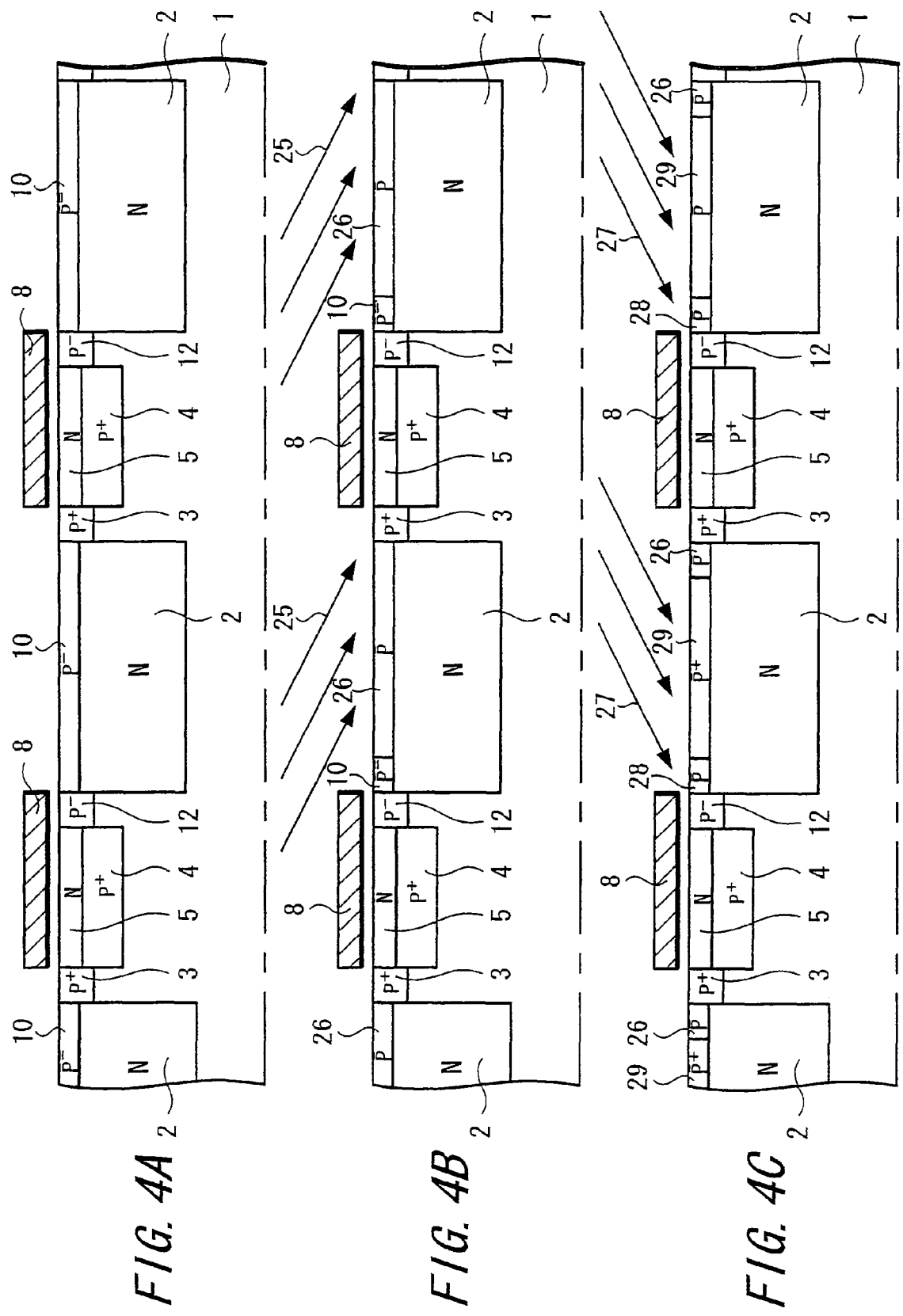
FIGS. 4A to 4C are diagrams showing another method of forming the positive charge accumulated area.

Further, as shown in FIG. 2B, instead of forming the P-type positive charge accumulated area 6 of high impurity concentration (P⁺) by using the mask 21, the P-type positive charge accumulated area (Hole Accumulated Layer) 6 of high impurity concentration (P⁺) and the positive charge accumulated area 10 of low impurity concentration can be formed separately also by implanting P-type ion in the direction of the electrode and in the direction of the opposite end on the side of the pixel-separation area respectively, for example, as shown in FIGS. 4A to 4C.

Specifically, ion implantation 25 of P-type impurity is performed obliquely from the state in FIG. 4A (the same state as in FIG. 2A) toward the channel stop area (pixel-separation area) 3 as shown in FIG. 4B. On this occasion, the charge-transfer electrode 8 serves as the mask for ion implantation.

By doing so, of the surface of the N-type semiconductor area (photoelectric conversion area) 2, the center and the end on the side of the channel stop area (pixel-separation area) 3 will contain a higher concentration of P-type impurities, thus changing from the P⁻ area 10 into a P-type area 26. However, the end on the side of the charge-transfer electrode 8 remains the P⁻ area 10.

Further, as shown in FIG. 4C, ion implantation 27 of P-type impurities is performed obliquely toward the charge-transfer electrode 8. The charge-transfer electrode 8 also serves as the mask for ion implantation at this time.

By doing so, of the surface of the N-type semiconductor area (photoelectric conversion area) 2, the center and the end on the side of the charge-transfer electrode 8 will contain a higher concentration of P-type impurities, so that the end on the side of the charge-transfer electrode 8 changes from the P⁻ area 10 into a P-type area 28 and the center changes from the P-type area 26 into a P⁺ area 29; and the end on the side of the channel stop area (pixel-separation area) 3 remains the P-type area 26.

Therefore, of the surface of the N-type semiconductor area (photoelectric conversion area) 2, the center is the P⁺ area 29 containing a high impurity concentration, and the end on the side of the charge-transfer electrode 8 and the end on the side of the channel stop area (pixel-separation area) 3 are the P-type area 28 containing a lower impurity concentration than that of the P+ area 29.

According to the above-described embodiment, since the application of voltage V to the light-shielding film 9 causes an auxiliary electric field in the channel stop area (pixel-separation area) 3, reading gate portion 12, and positive charge accumulated areas 6, 10, the effect of two-dimensional modulation made by the N-type semiconductor area (photoelectric conversion area) 2 or the like can be reduced; and therefore the potential depth in the channel stop area (pixel-separation area) 3, reading gate portion 12, and positive charge accumulated areas 6, 10 can be made variable.

Moreover, with changing an impurity concentration in a horizontal direction of positive charge accumulated areas 6, 10 on the surface of the light-receiving sensor portion 11 to form the positive charge accumulated area 6 of a high impurity concentration (P+) in the center, and to form the positive charge accumulated area 10 (10A, 10B) of a low impurity concentration (P−) at the ends on the side of the reading gate portion 12 and on the side of the channel stop area (pixel-separation area) 3, the potential depth in each portion can be corrected appropriately.

Consequently, all of the blooming characteristic, readout characteristic, pixel-separation characteristic, and noise characteristic can be secured favorably.

This makes it possible to obtain the satisfactory noise characteristic and readout characteristic, even though a pixel is miniaturized in size and the number thereof increases; and therefore, by using the solid-state imaging device according to this embodiment, a camera or the like can be miniaturized and a high resolution and a high picture quality can be obtained.

Note that, if only a small difference in P-type impurity concentration exists between the positive charge accumulated area (Hole Accumulated Layer) 10 of a low impurity concentration (P−) and the positive charge accumulated area (Hole Accumulated Layer) 6 of a high impurity concentration (P+), the above-described action and results can be attained.

In addition, in the above-described embodiment, the light-shielding film 9 is made to be a single body and the same voltage V is applied thereon, however, the light-shielding film may include, for example, a plurality of light-shielding films electrically independent from each other and a different voltage is applied to each light-shielding film.

Although the voltage V is applied to the light-shielding film 9 in the above-described embodiment, it is possible to provide a conductive sidewall next to the charge-transfer electrode and the voltage is applied to the sidewall instead to obtain the same effect.

An embodiment in this case will be described next.

Figure 5:
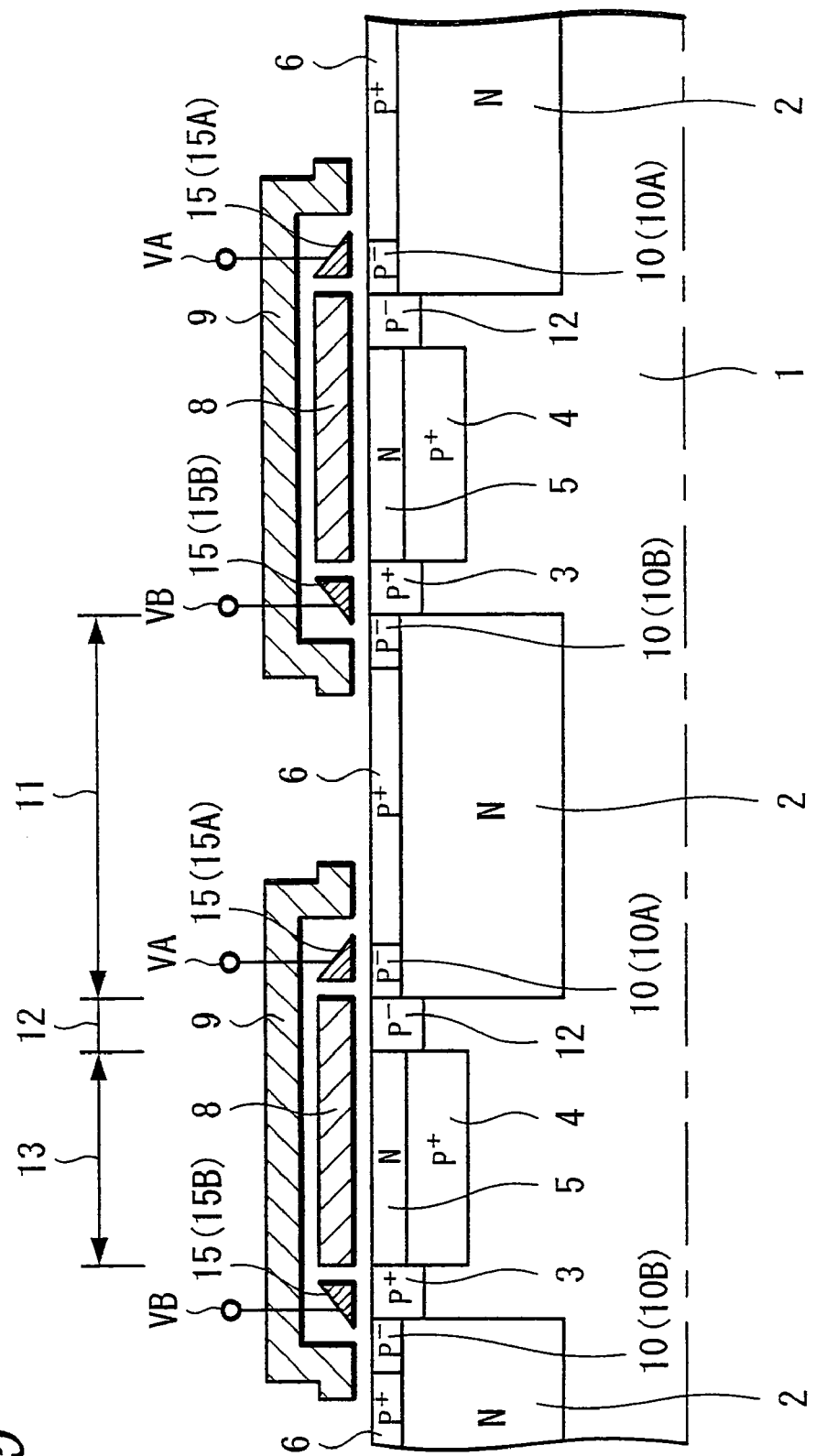
FIG. 5 is a schematic structure diagram (section) of a solid-state imaging device according to another embodiment of the present invention.

FIG. 5 shows a schematic structure diagram (section) of another embodiment of a solid-state imaging device according to the present invention.

A solid-state imaging device according to this embodiment is particularly provided with conductive sidewalls 15 (15A, 15B) beside the charge-transfer electrode 8, and is arranged so that voltages VA, VB can be applied to the sidewalls 15 (15A, 15B). The voltage VA is applied to the sidewall 15A on the side of the reading gate portion 12 of the charge-transfer electrode 8, and the voltage VB is applied to the sidewall 15B on the side of the channel stop area 3.

These sidewalls 15A and 15B are insulated from the charge-transfer electrode 8 by an insulating film and are arranged to be electrically independent from each other so that different voltages VA and VB can be applied respectively.

The light-shielding film 9 is formed to cover the charge-transfer electrode 8 and sidewalls 15A, 15B on both sides thereof.

Note that, in this embodiment, the voltage is not applied to the light-shielding film 9.

Then, the P-type positive accumulated area (Hole Accumulated Layer) 10 (10A, 10B) of low impurity concentration (P−) is formed similarly to the preceding embodiment at the end of the surface of the sensor portion in the vicinity of the sidewalls 15A and 15B.

The other structure is the same as that of the solid-state imaging device according to the preceding embodiment shown in FIG. 1, so that the same symbols are affixed thereto to dispense with the repeated description.

As to the voltages VA and VB to be applied to the sidewalls 15A and 15B, the same voltage V as applied to the above-described light-shielding film 9, a fixed bias voltage or a pulse voltage may be applied, for example.

Further, the applied voltages VA and VB are set so that a satisfactory readout characteristic and a satisfactory noise characteristic can be acquired.

For example, a fixed bias voltage in the range from the ground potential (zero potential) to a negative potential is selected as the voltage VA applied to the sidewall 15A on the side of the reading gate portion 12 to make the readout characteristic satisfactory. On the other hand, a fixed bias voltage of a negative potential is selected as the voltage VB applied to the sidewall 15B on the side of the channel stop area 3 to weaken electric field intensity for pinning the peripheral potential.

The above-described conductive sidewalls 15 (15A, 15B) can be formed, for example, as follows.

First, after the charge-transfer electrode 8 has been formed, an insulating film is formed on the surface thereof.

Next, a conductive film is deposited on the whole surface and this conductive film is etched back to form the sidewalls.

Figure 6A:
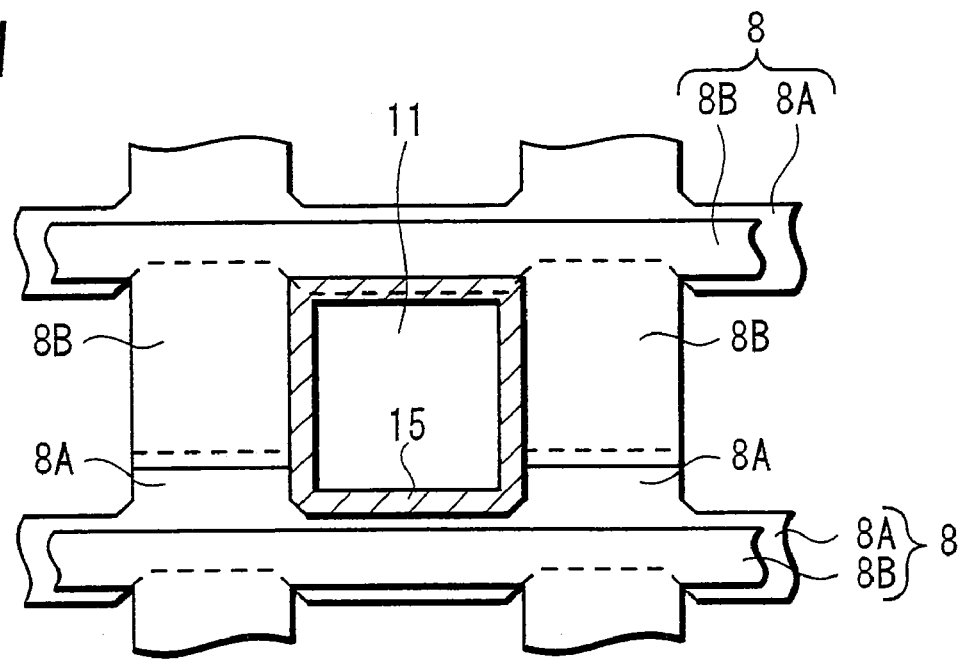
FIGS. 6A and 6B are diagrams to explain patterning of a sidewall.
Figure 6B:
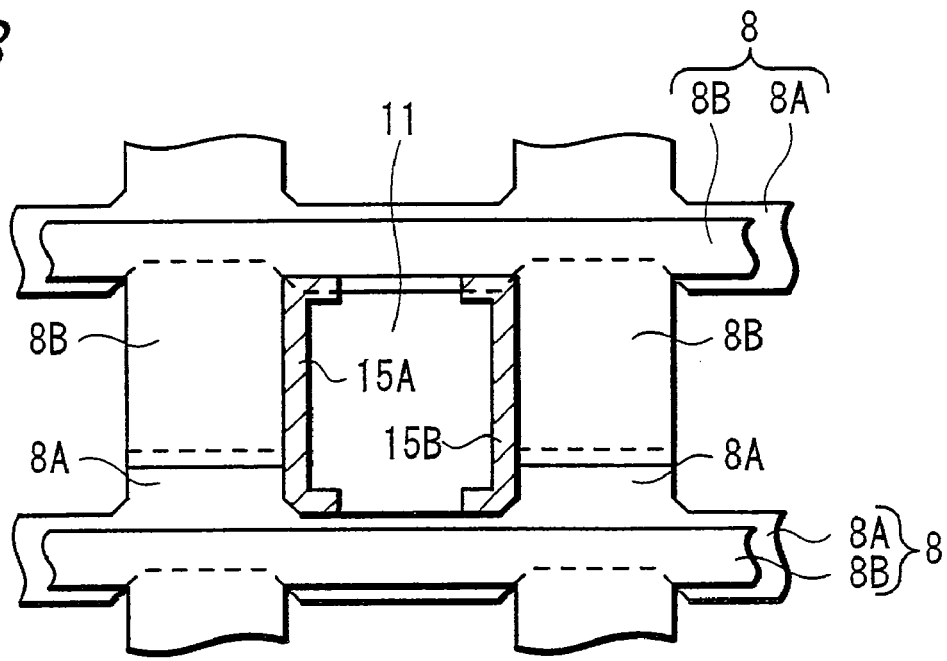

Further, by patterning, as shown in FIG. 6B, a sidewall (a hatched portion in FIG. 6A) 15 formed around the light-receiving sensor portion 11, a sidewall 15A on the side of the reading gate portion 12 is electrically separated from a sidewall 15B on the side of the channel stop area 3. Note that, in FIGS. 6A and 6B, the insulating film between the charge-transfer electrode 8 (8A, 8B) and sidewalls 15A and 15B is not shown; and a space between the charge-transfer electrode 8 and sidewalls 15A, 15B is not shown.

In this way, the sidewalls 15A and 15B can be formed.

Further, after the sidewalls 15A and 15B have been formed, an insulating film is formed to cover the surface and then contact holes are formed through this insulating film.

Thus, a wiring layer and the sidewalls 15A, 15B can be connected with each other through the contact holes.

In this connection, if in FIG. 6B the contact holes are formed directly on the sidewalls 15A and 15B, because the sidewalls are narrow in width, it will be difficult to form the contact holes.

Then, when the sidewall is formed by etching back, part of the conductive film is made to be left on the charge-transfer electrode, and then the contact holes are formed in the conductive film left on the charge-transfer electrode to be connected to the wiring layer.

Figure 7A:
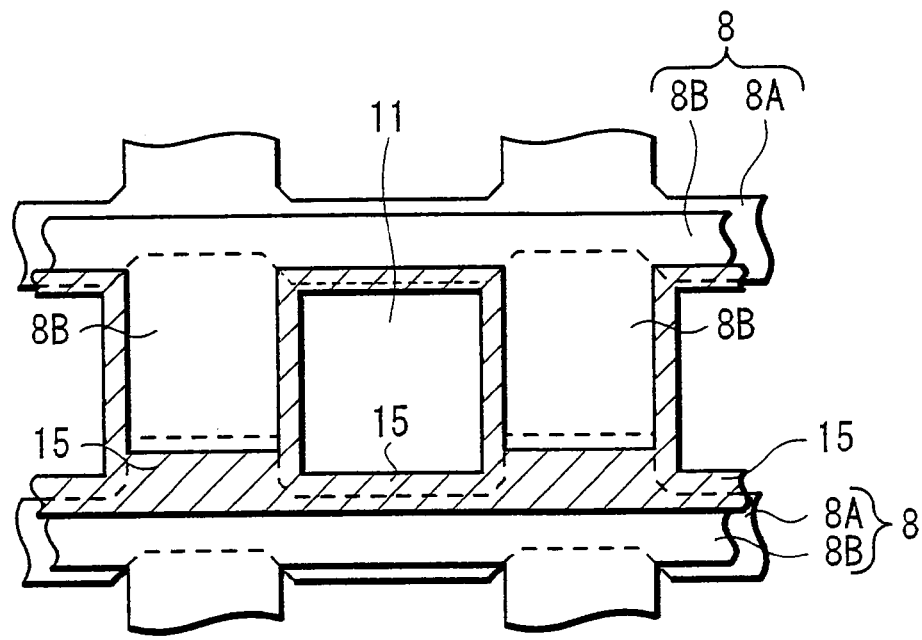
FIGS. 7A and 7B are diagrams for explaining a method of forming the wiring connected to the sidewall.

Specifically, as shown in FIG. 7A for example, when the sidewall 15 is formed by etching back, a conductive film 15 is left on part of the charge-transfer electrode 8, in this case, on part of a charge-transfer electrode 8A which is the lower layer. For example, etch back may be performed in a state where part of the conductive film 15 to be left is covered with a mask.

Figure 7B:
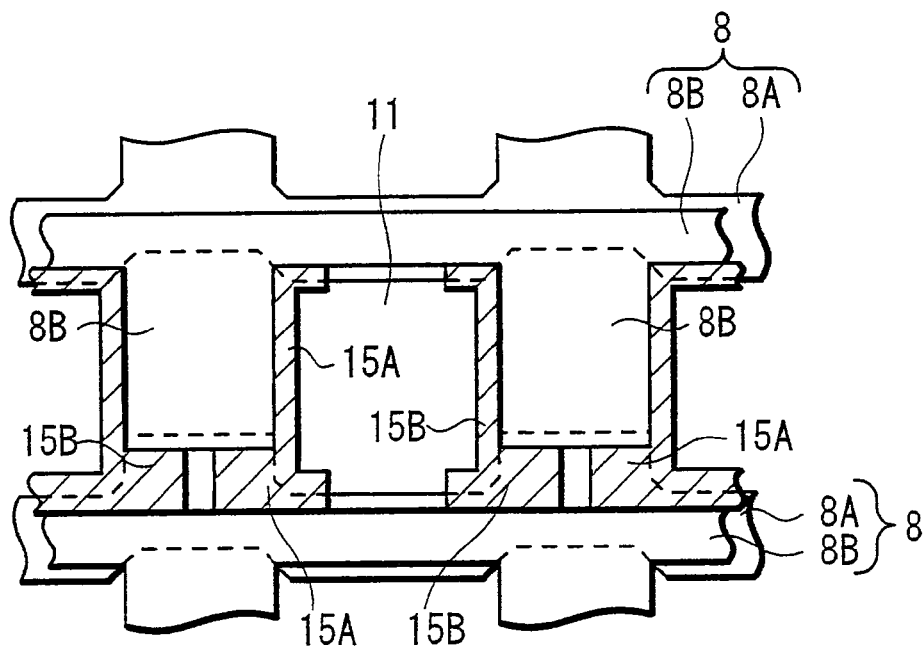
Figure 8:
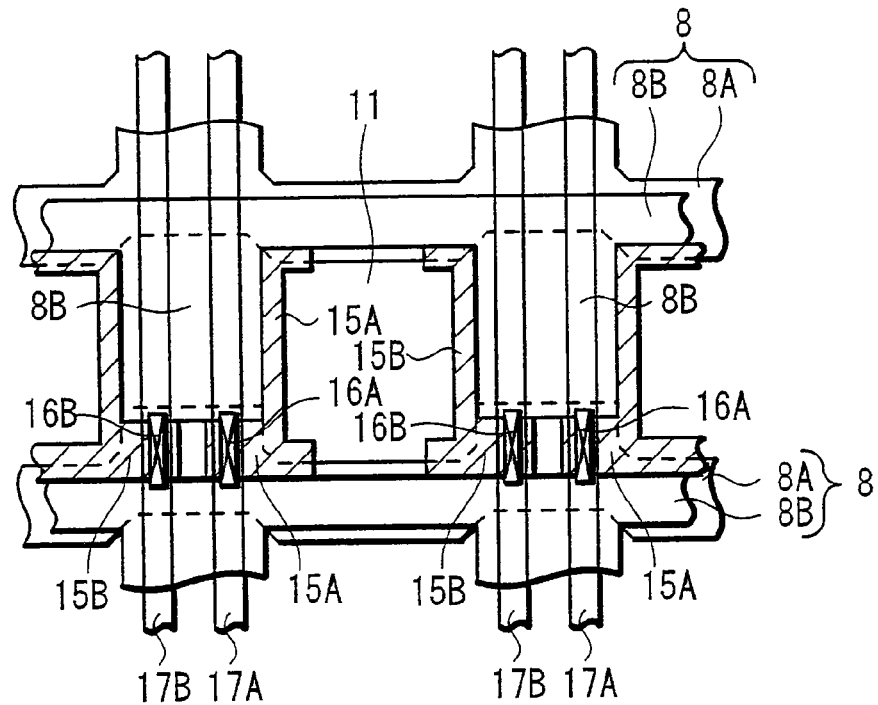
FIG. 8 is a diagram for explaining a method of forming the wiring connected to the sidewall.

Subsequently, as shown in FIG. 7B, the sidewall 15 is patterned to separate electrically the sidewall 15A on the side of the reading gate portion 12 from the sidewall 15B on the side of the channel stop area 3.

Next, an interlayer insulation film, though not shown, is deposited on the sidewalls 15A, 15B and then contact holes are formed in the interlayer insulation film right above the sidewalls 15A, 15B on the charge-transfer electrode 8.

The contact holes are filled with a conductive layer to form contact portions 16A and 16B, which are connected to the wiring 17A and 17B.

In this way, an electrode for driving the sidewalls 15A and 15B can be formed.

Figure 9:
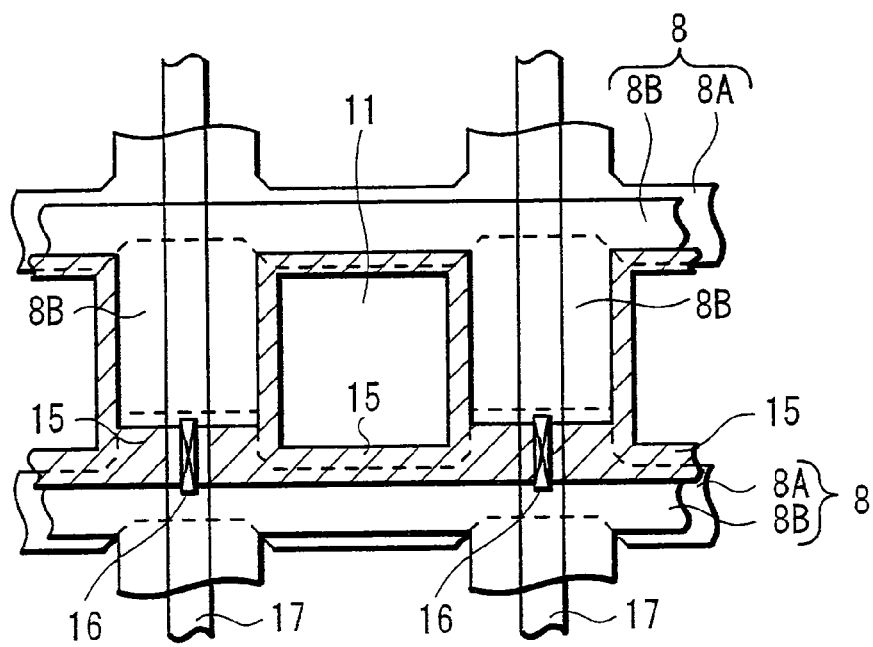
FIG. 9 is a diagram for explaining the wiring connected to the sidewall.

Note that, when the sidewall 15 is not electrically separated into the side of the reading gate portion 12 and the side of the channel stop area 3, as shown in FIG. 9 for example, a contact portion 16 is formed at about the center of the conductive film 15 left on the charge-transfer electrode 8 from the state in FIG. 7A and the contact portion 16 is connected to the wiring 17.

According to this embodiment, because the voltages VA and VB can be applied to the conductive sidewalls 15 (15A, 15B) provided beside the charge-transfer electrode 8, and further P-type positive charge accumulated areas 10 (10A, 10B) of low impurity concentration ($P^-$) are formed at the ends on the surface of the light-receiving sensor portion 11 in the vicinity of the sidewall 15, similarly to the preceding embodiment, it is possible to suppress a rise in the reading voltage as well as noise generated due to an electric field near the channel stop area 3.

Accordingly, both of the readout characteristic and noise characteristic can be made satisfactory.

Further, since the satisfactory noise characteristic and readout characteristic can be obtained, even though a pixel is miniaturized in size and the number thereof increases, by using the solid-state imaging device according to this embodiment, a camera or the like can be miniaturized and a high resolution and a high picture quality can be obtained.

Further, this embodiment can have the structure in which a tip portion of the sidewalls 15 (15A, 15B) is made to be self-aligned with the P-type positive charge accumulated area 6 of high impurity concentration ($P^+$).

Figure 10:
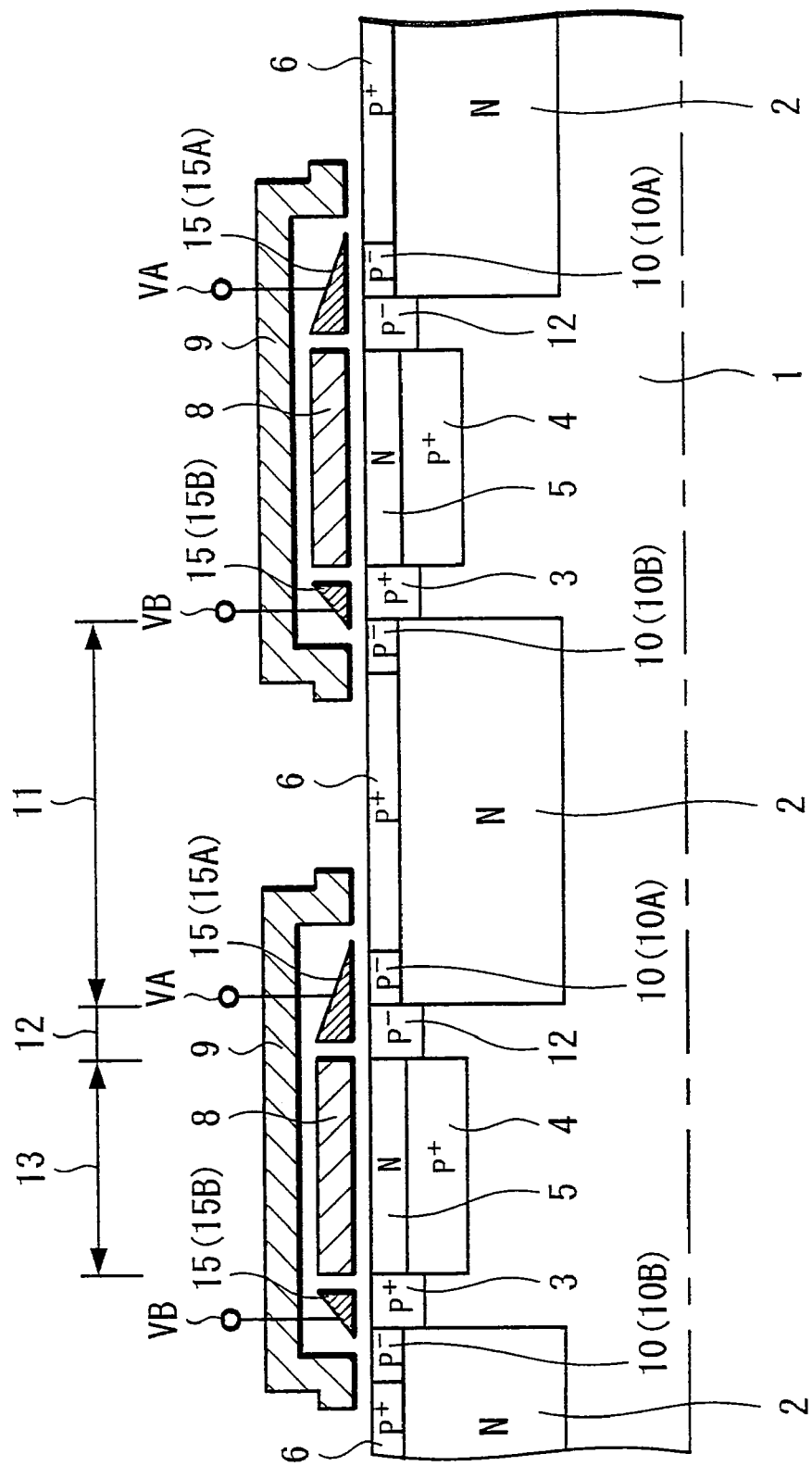
FIG. 10 is a schematic structure diagram (section) of a solid-state imaging device according to further another embodiment of the present invention.

Next, FIG. 10 shows a schematic structure diagram (section) of still another embodiment of a solid-state imaging device according to the present invention, which has a modified form of the structure shown in FIG. 5.

This embodiment has a sidewall 15A formed on the side of the reading gate portion 12, which particularly extends over the reading gate portion 12. The charge-transfer electrode 8 is formed at the vertical transfer register 13 accordingly.

Since the other structure is the same as that in FIG. 5, the same symbols are affixed to dispense with repeated description.

Similarly to the structure in FIG. 5, this embodiment can also suppress a rise in the reading voltage as well as noise generated due to an electric field near the channel stop area 3, thus both of the readout characteristic and noise characteristic can be made satisfactory.

Note that, in this embodiment, because the sidewall 15A on the side of reading gate portion 12 is formed extending to the reading gate portion 12 also, the optimum value of voltage VA applied to the sidewall 15A may be different from the optimum value of voltage VA in the preceding embodiment shown in FIG. 5.

In this case also, tips of the sidewalls 15 (15A, 15B) may be made to be self-aligned with the P-type positive charge accumulated area 6 of high impurity concentration ($P^+$).

In each of the above-described embodiments shown in FIG. 5 or FIG. 10, with respect to the sidewalls 15 (15A, 15B) provided beside the charge-transfer electrode 8, the sidewall 15A on the side of the reading gate portion 12 and the sidewall 15B on the side of the channel stop area 3 are electrically independent from each other and a different voltage is applied to each of them.

The present invention is not limited to these structures. For example, such a structure is possible that these sidewalls are linked in front or in back not shown, and are connected electrically (for example, a case where the patterning is not performed on the state shown in FIG. 6A). In this case, similarly to the structure in which a voltage is applied to the light-shielding film, the same voltage is applied on the side of the reading gate portion and on the side of the channel stop area.

Moreover, in each of the above-described embodiments shown in FIG. 5 or FIG. 10, a voltage V may further be applied to the light-shielding film 9. In this case, by adjusting the respective voltages VA, VB and V, it is possible to optimize effectively the control of the potential in respective portions.

In each of the above-described embodiments, the P-type positive charge accumulated area 10 of low impurity concentration ($P^-$) is formed in the vicinity of the reading gate portion 12 and in the vicinity of the channel stop area (pixel-separation area) 3 on the surface of the light-receiving sensor portion 11; however, in the present invention, the semiconductor area formed in the vicinity of the reading gate portion and in the vicinity of the channel stop area (pixel-separation area) on the surface of the light-receiving sensor portion is not limited to P-type, that is, the same conductivity type as that of the positive charge accumulated area containing a high impurity concentration ($P^+$) in the center on the surface of the light-receiving sensor portion.

For example, an almost genuine semiconductor area or a conductivity type area opposite to that of the center portion ($P^+$) containing a low impurity concentration (N- or N) may be employed. In any case, a semiconductor area containing a lower impurity concentration than that of the center ($P^+$) must be employed.

Figure 11:
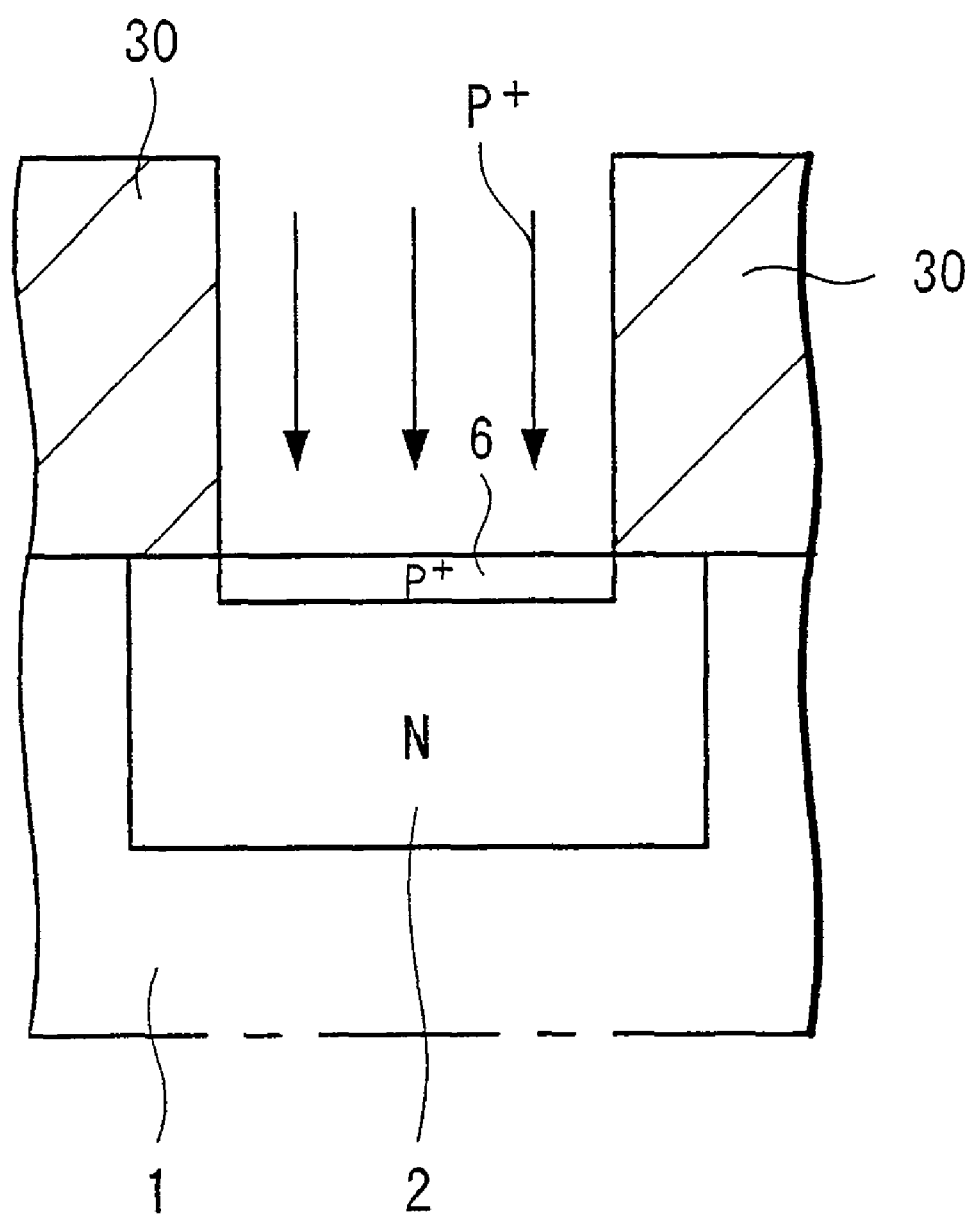
FIG. 11 is a diagram showing another method of forming the positive charge accumulated area.

When this area is made to be of N-type, such a forming method is conceivable that, as shown in FIG. 11 for example, after an N-type semiconductor area 2 has been formed, a mask 30 having a narrower opening is employed to inject a p-type impurity of high concentration ($P^+$) only into the vicinity of the center on the surface. When this forming method is adopted, because $P^+$ is apt to diffuse to an N side, it is preferable to make the opening of the mask 30 rather small in anticipation of the diffusing range.

Having described above the embodiments in which the present invention is applied to a CCD solid-state imaging device, the present invention is also applicable to a solid-state imaging device having other structures.

The present invention can be applied to, for example, a solid-state imaging device having other charge-transfer portions than the CCD-type structure.

Further, also in a CMOS-type solid-state imaging device for example, there may be a case where the $P^+$ positive charge accumulated area is provided on the surface of the N-type semiconductor area forming the photoelectric conversion area of the light-receiving sensor portion to form a HAD sensor.

The present invention can also be applied to the CMOS-type solid-state imaging device using the HAD sensor, specifically, the conductive sidewalls are provided with respect to the gate for reading charge from the light-receiving sensor portion to a signal line, and a voltage is applied to the sidewalls, with the surface of the light-receiving sensor portion in the vicinity of the sidewalls being a semiconductor area containing a lower impurity concentration than that of the center on the surface of the light-receiving sensor portion, thereby obtaining an effectiveness of improving the noise characteristic and readout characteristic.

The case will be described next.

Figure 12:
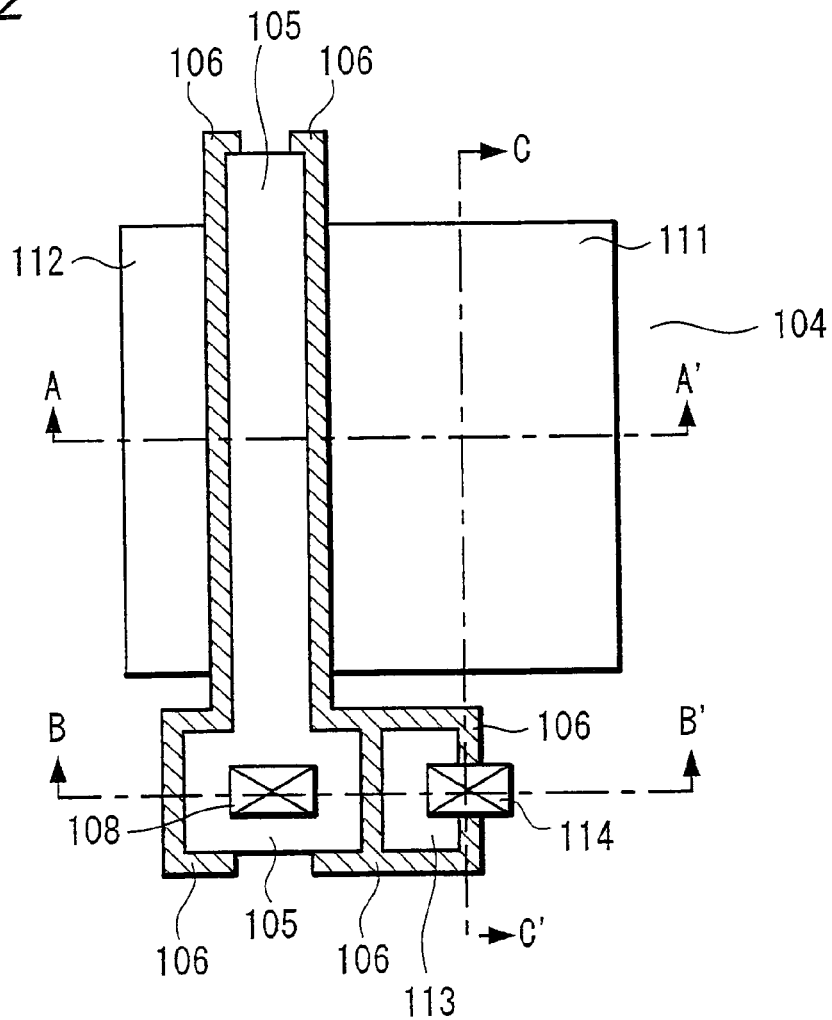
FIG. 12 is a schematic structure diagram (plan) of a solid-state imaging device according to another embodiment of the present invention.
Figure 13:
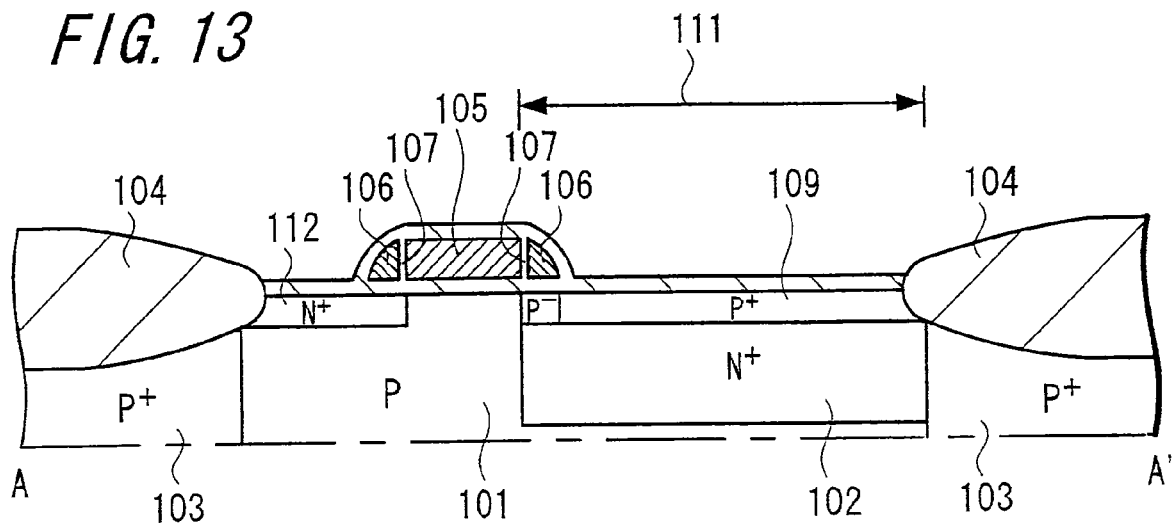
FIG. 13 is a section taken along a line A-A' in FIG. 12.
Figure 14:
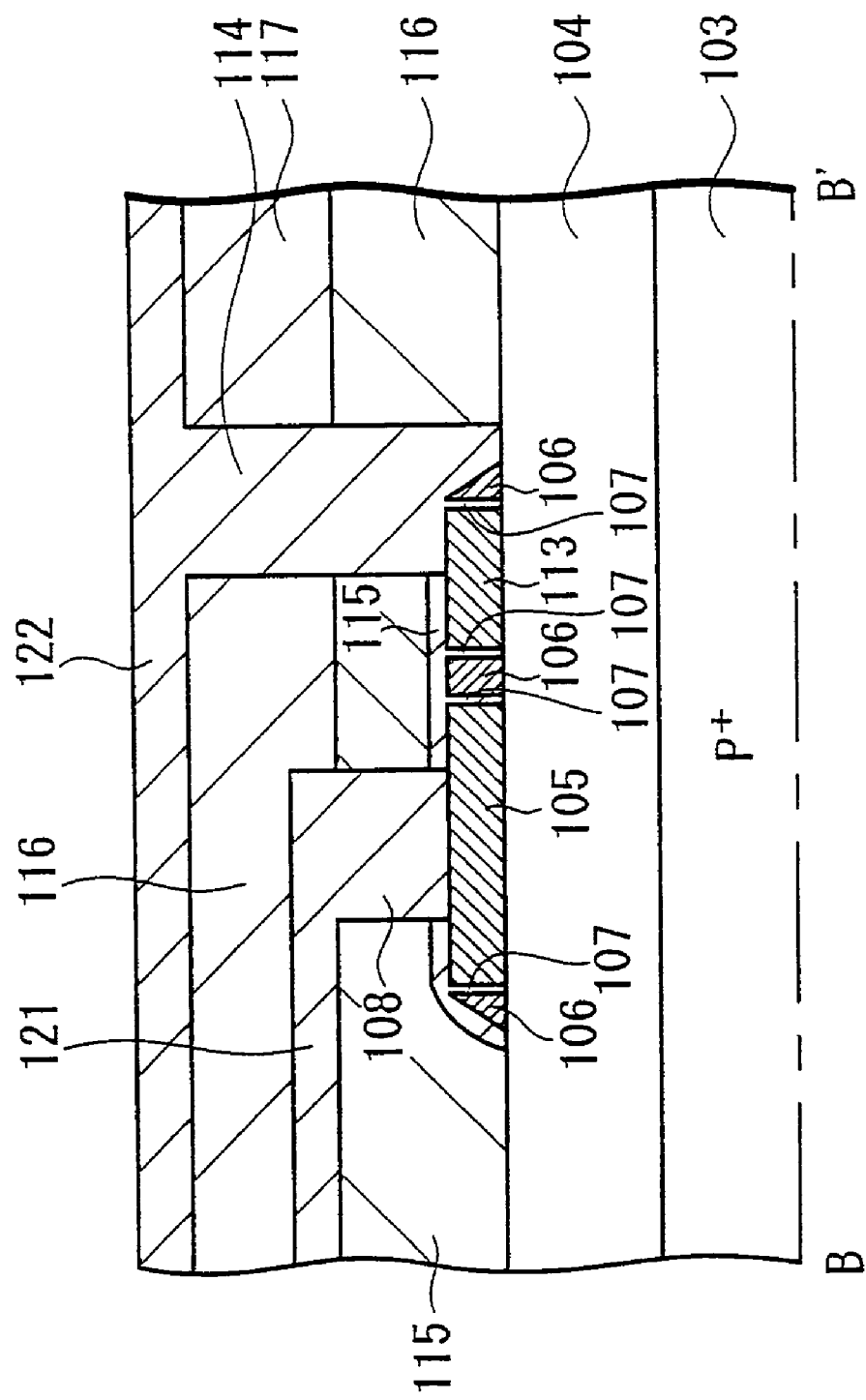
FIG. 14 is a section taken along a line B-B' in FIG. 12.
Figure 15:
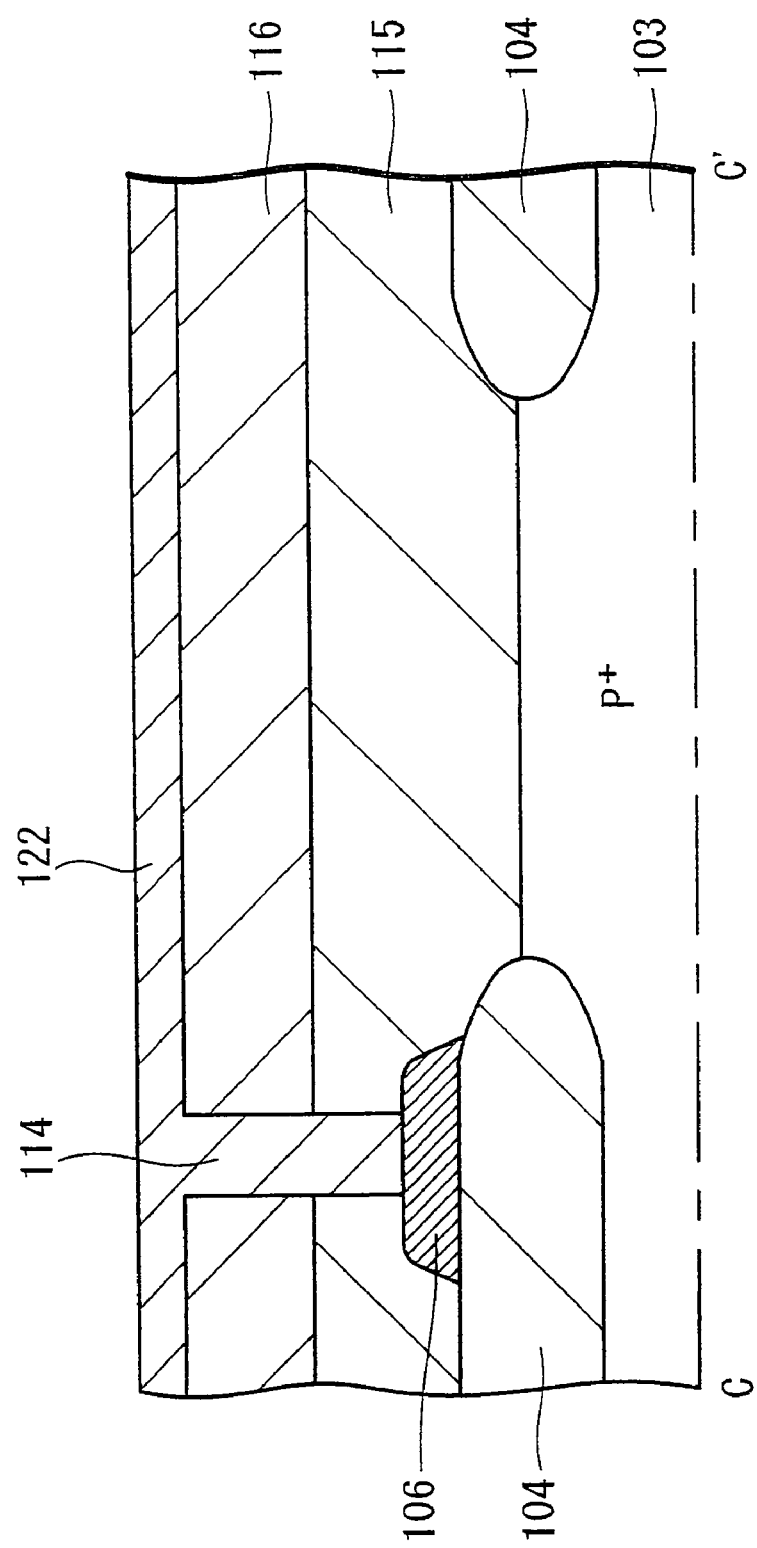
FIG. 15 is a section taken along a line C-C' in FIG. 12.
Figure 16:
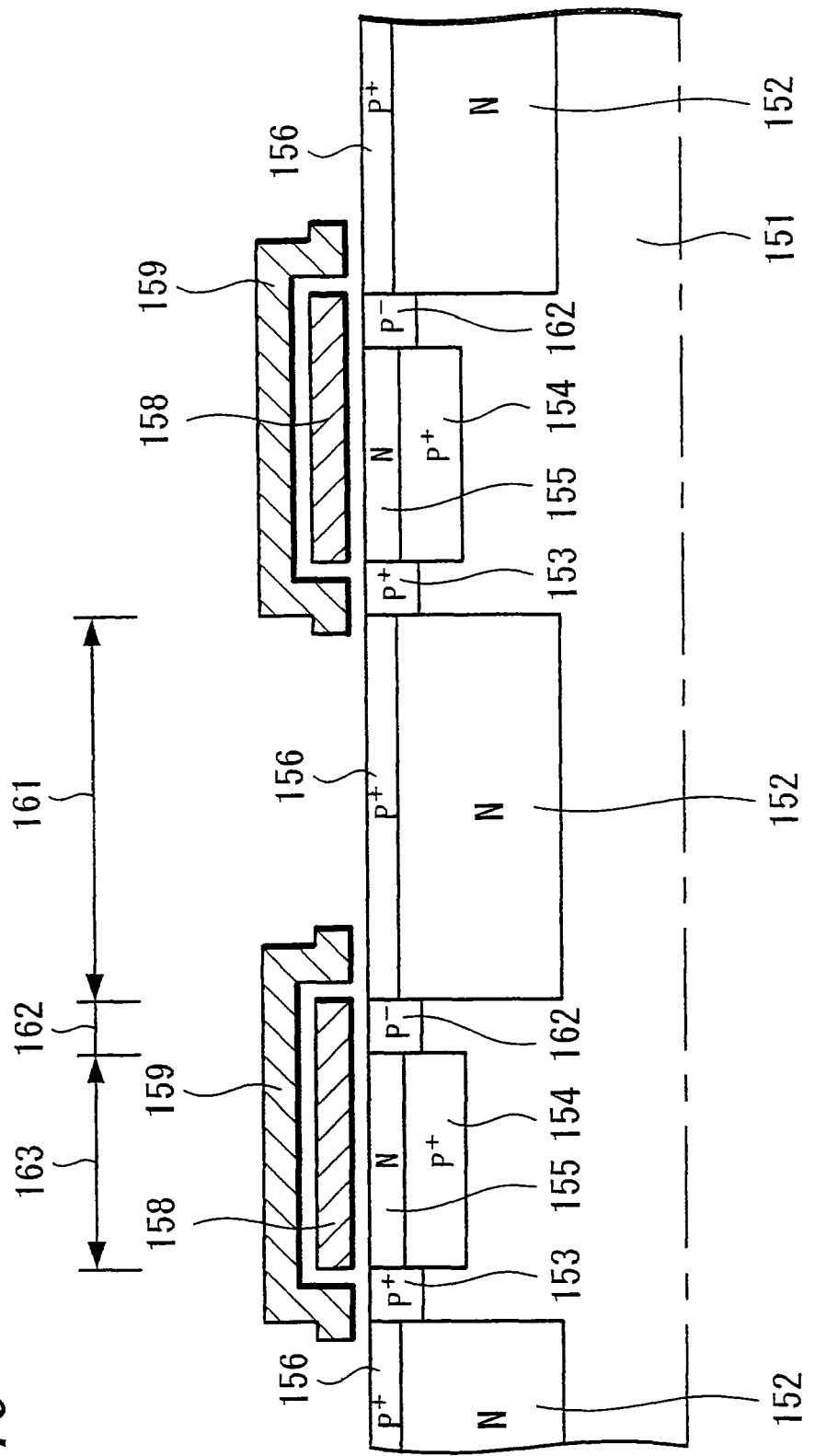
FIG. 16 is a section of the conventional CCD solid-state imaging device employing the HAD sensor.

FIG. 12 shows a schematic structure diagram (plan) of a solid-state imaging device as a different embodiment according to the present invention. In this embodiment, the present invention is applied to a CMOS-type solid-state imaging device. FIG. 13 shows a section taken along a line A-A' in FIG. 12, FIG. 14 shows a section taken along a line B-B', and FIG. 15 shows a section taken along a line C-C', in FIG. 12 respectively.

This solid-state imaging device has such a structure that, on a P-type semiconductor area 101 are formed a first-conductivity-type, for example, N-type semiconductor area 102 forming a photoelectric conversion area, a second-conductivity-type, for example, P-type channel stop area 103, a pixel-separation area 104 made of a thick insulating layer on the channel stop area 103, and a FD (Floating Diffusion) portion 112 made by the first-conductivity-type impurity area, for example, $N^+$ area; further, on the surface of the N-type semiconductor area 102 forming the photoelectric conversion area is formed the second-conductivity-type, for example, P-type positive charge accumulated area (Hole Accumulated Layer) 109. These N-type semiconductor area 102 and positive accumulated area (Hole Accumulated Layer) 109 constitutes a light-receiving sensor portion 111.

On the P-type semiconductor area 101 is formed a charge-reading electrode 105 through a gate insulation film.

Further, conductive sidewalls 106 are formed on both sides of the charge-reading electrode 105 through thin insulating films 107. Note that, the insulating film 107 is not shown in a plan view of FIG. 12. The conductive sidewall 106 is designed so that a voltage independent from a reading voltage applied to the charge-reading electrode 105 can be applied thereon.

The charge-reading electrode 105 is provided between the light-receiving sensor portion 111 and FD portion 112, and is formed on the pixel-separation area 104 outside the light-receiving sensor portion 111 and FD portion 112. A contact portion 108 is formed at a position above the pixel-separation area 104 shown in the lower part of FIG. 12.

A reference numeral 113 denotes a buffer layer for sidewall contact and can be formed, for example, by using the same material as that of the charge-reading electrode 105 and by patterning simultaneously with the charge-reading electrode 105. In the drawing, 114 denotes a contact portion between the sidewall 106 and wiring; 121 denotes wiring for the charge-reading electrode 105; 122 denotes wiring for the sidewall 106.

In this way, by connecting the contact portion and wiring separately to the charge-reading electrode 105 and sidewall 106, the charge-reading electrode 105 and sidewall 106 can be driven separately.

Further, though not shown, by forming a light-shielding film covering other areas than the light-receiving sensor portion 111, it is possible to prevent light from entering a channel area, FD portion 112 or the like below the charge-reading electrode 105.

In this embodiment, a positive charge accumulated area (Hole Accumulated Layer) on the surface of the light-receiving sensor portion 111 is made of a positive charge accumulated area (Hole Accumulated Layer) 109 of high impurity concentration ($P^+$) in the center and a positive charge accumulated area (Hole Accumulated Layer) 110 of low impurity concentration ($P^-$) at the end on the side of the charge-reading electrode 105 (and sidewall 106).

This structure makes it possible to improve both of the readout characteristic and noise characteristic, similarly to the case where the present invention is applied to the CCD solid-state imaging device described above.

In addition, in this embodiment, a positive charge accumulated area of low impurity concentration ($P^-$) may be formed at the end on the side of pixel-separation area 104.

The solid-state imaging device according to this embodiment can be manufactured, for example, as follows.

After each of the pixel-separation area 104, channel stop area 103, light-receiving sensor portion 111, FD portion 112, charge-reading electrode 105, and sidewall contact buffer layer 113 has been formed, a thin insulation film 107 is formed on the surface of the charge-reading electrode 105 and buffer layer 113.

Next, a conductive film is deposited on the whole surface and this conductive film is etched back to form the sidewall 106 on a lateral wall of the charge-reading electrode 105 and buffer layer 113.

Subsequently, an insulating film 115 is formed on the surface of the charge-reading electrode 105, buffer layer 113, and sidewall 106, and further the whole is covered with a thick interlayer insulation film 116.

Then, a contact hole is bored in the interlayer insulation film 116 on the charge-reading electrode 105 and a conductive layer is formed in the contact hole to make a contact portion 108. This contact portion 108 is connected to a wiring 121.

Further, after the whole surface has been covered with an interlayer insulation film 117, a contact hole is bored through the upper interlayer insulation film 117 and the lower interlayer insulation film 116 to extend over both of the sidewall contact buffer layer 113 concurrently formed with the charge-reading electrode 105 and the sidewall 106 formed around the buffer layer. After that, a conductive layer is formed in the contact hole to make a contact portion 114. This contact portion 114 is connected to wiring 122.

In addition, although a $P^+$ positive charge accumulated area 6 is formed in the center on the surface of the N-type semiconductor area 2 in each of the above-described embodiments, a conductivity type of the photoelectric conversion area is not limited in the present invention, and an N-type high impurity concentration area may be formed in the center on the surface of the P-type semiconductor area to make the light-receiving sensor portion.

That is to say, in the present invention, a second-conductivity-type area containing a high impurity concentration is formed in the center on the surface of a first-conductivity-type semiconductor area forming the photoelectric conversion area of the light-receiving sensor portion, whereas an area containing a lower impurity concentration than that of the center is formed at the end on the surface. A plus or minus sign and the like of the voltage applied to the light-shielding film or conductive sidewall can be selected corresponding to the conductivity type of the light-receiving sensor portion.

Moreover, although the conductive sidewalls are formed on both sides of the charge-transfer electrode in each of the embodiments shown in FIG. 5 and FIG. 10, the present invention is not limited to such embodiments and can be made as follows; on both sides of a first electrode, for example, of the charge-transfer electrode or the charge reading gate electrode of a CMOS-type solid-state imaging device are provided other electrodes made of a thick conductive film, similar to the charge-transfer electrode or gate electrode, so that a voltage independent from that of the charge-transfer electrode or of gate electrode can be applied to the other electrodes and their potential may be adjusted.

Next, a specific embodiment of the present invention with respect to the structure of a solid-state imaging device having the light-shielding film connected to a DC supply source or a pulse supply source, as well as a method of driving the solid-state imaging device in which the DC voltage or pulse voltage is applied to the light-shielding film at the time of reading will be described.

Figure 17A:
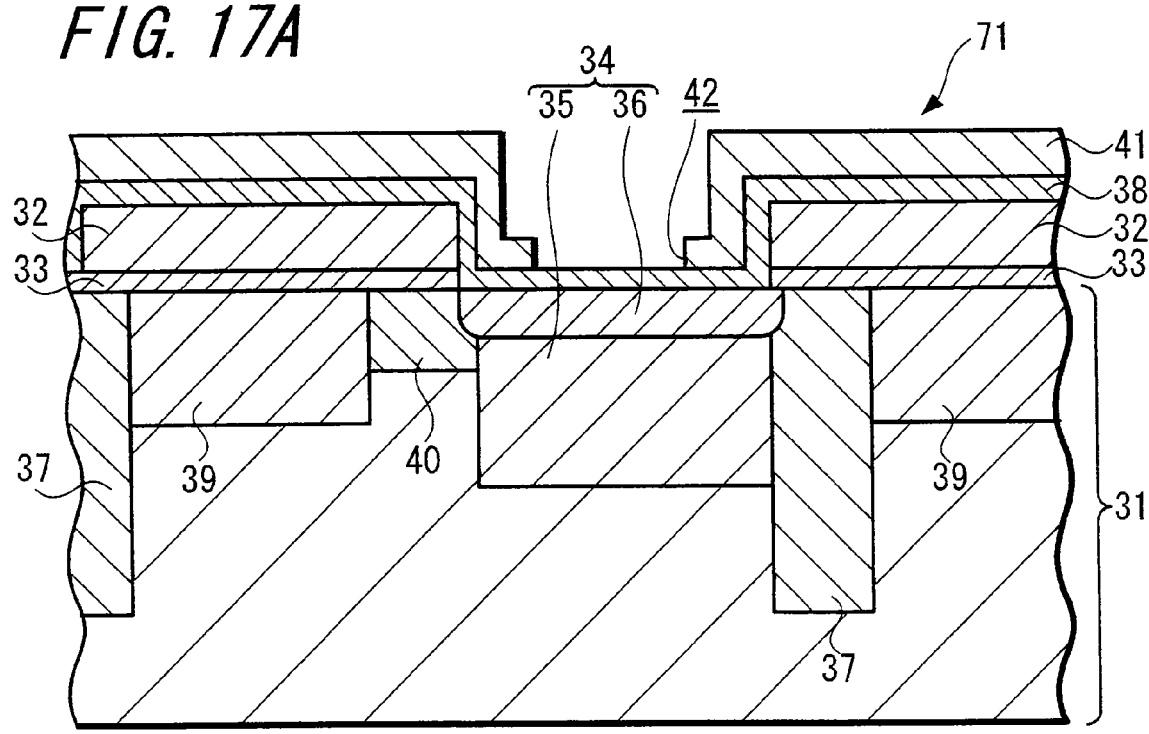
FIGS. 17A and 17B show a first embodiment according to a solid-state imaging device and the driving method thereof of the present invention.
Figure 17B:
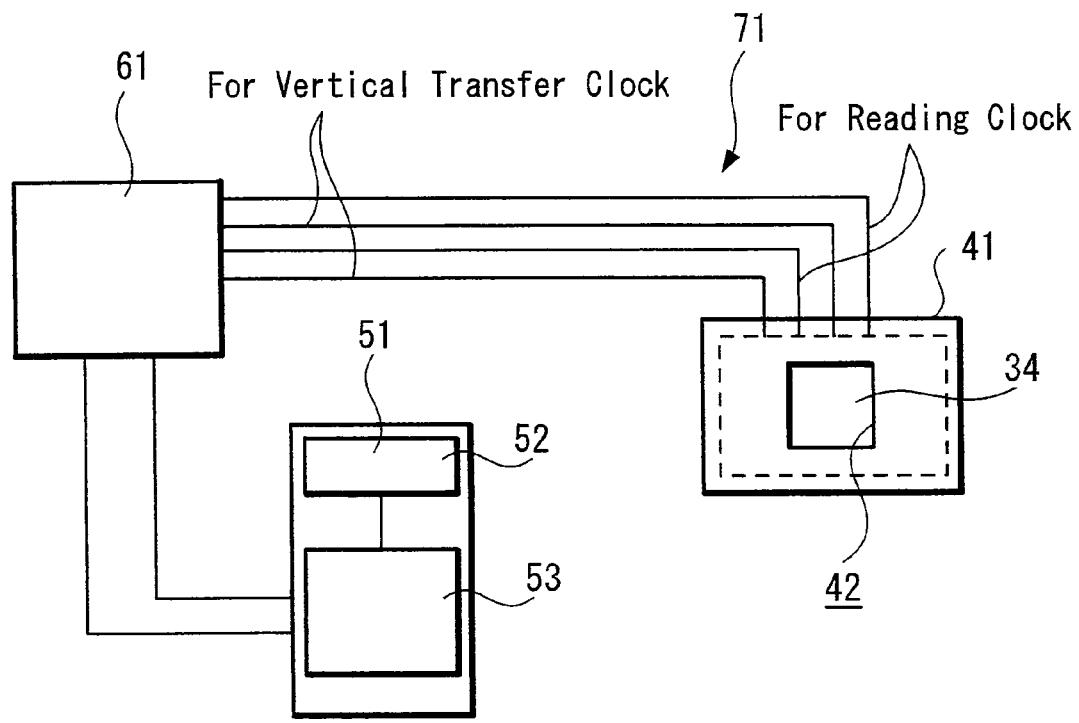

A first embodiment of the solid-state imaging device and the driving method thereof according to the present invention will be described with reference to FIGS. 17A and 17B. FIG. 17A is a schematic structure section showing a relevant part of the solid-state imaging device; FIG. 17B is a structure diagram of a relevant part of the solid-state imaging device. Note that, although the solid-state imaging device includes a large number of pixels, FIGS. 17A and 17B shows about one pixel as a representative.

As is shown in FIG. 17A, a solid-state imaging device 71 in this embodiment has an electrode 32 serving as both the reading electrode and transfer electrode formed on a semiconductor substrate 31 through an insulating film 33. A reading gate 40 is formed on the semiconductor substrate 31 under a portion of the electrode 32 serving as the reading electrode. A vertical register 39 made of a charge-coupled device is formed on the semiconductor substrate 31 under a portion of the electrode 32 serving as the transfer electrode. Further, a sensor portion 34 is formed between the electrode 32 and another electrode 32 of adjacent pixel. This sensor portion 34 is made of, for example, HAD, in which, For example, an n-type diffusion layer 35 is formed to make a pn junction with a p-type diffusion layer 36 formed thereon. In other words, a p-type diffusion layer is formed on the side of the surface of the sensor portion 34. Further, a channel stop layer 37 is formed between the sensor portion 34 and the adjacent pixel area. Thus, when a pixel is seen in a horizontal transfer direction, the channel stop layer 37, vertical register 39, reading gate 40, and sensor portion 34 are arranged in order.

Moreover, a light-shielding film 41 provided with an opening 42 above the sensor portion 34 is formed through an insulating film 38 covering the electrode 32, sensor portion 34, and the like.

As is shown in FIG. 17B, this light-shielding film 41 is formed of, for example, tungsten and is connected to a DC supply source 51. The DC supply source 51 includes, for example, a power source 52 for supplying the DC voltage and a voltage converter 53 for changing the voltage to a desired voltage. The sensor portion 34 in solid-state imaging device 71 covered with the light-shielding film 41 converts received light into an electric signal by photoelectric conversion, and receives a reading clock to send the signal to a driver/transfer gate 61. The driver/transfer gate 61 receives a vertical transfer clock to transfer the signal in a vertical direction. Furthermore, the driver/transfer gate 61 receives the reading clock to make an instruction about the application of DC voltage on the light-shielding film 41.

Figure 18:
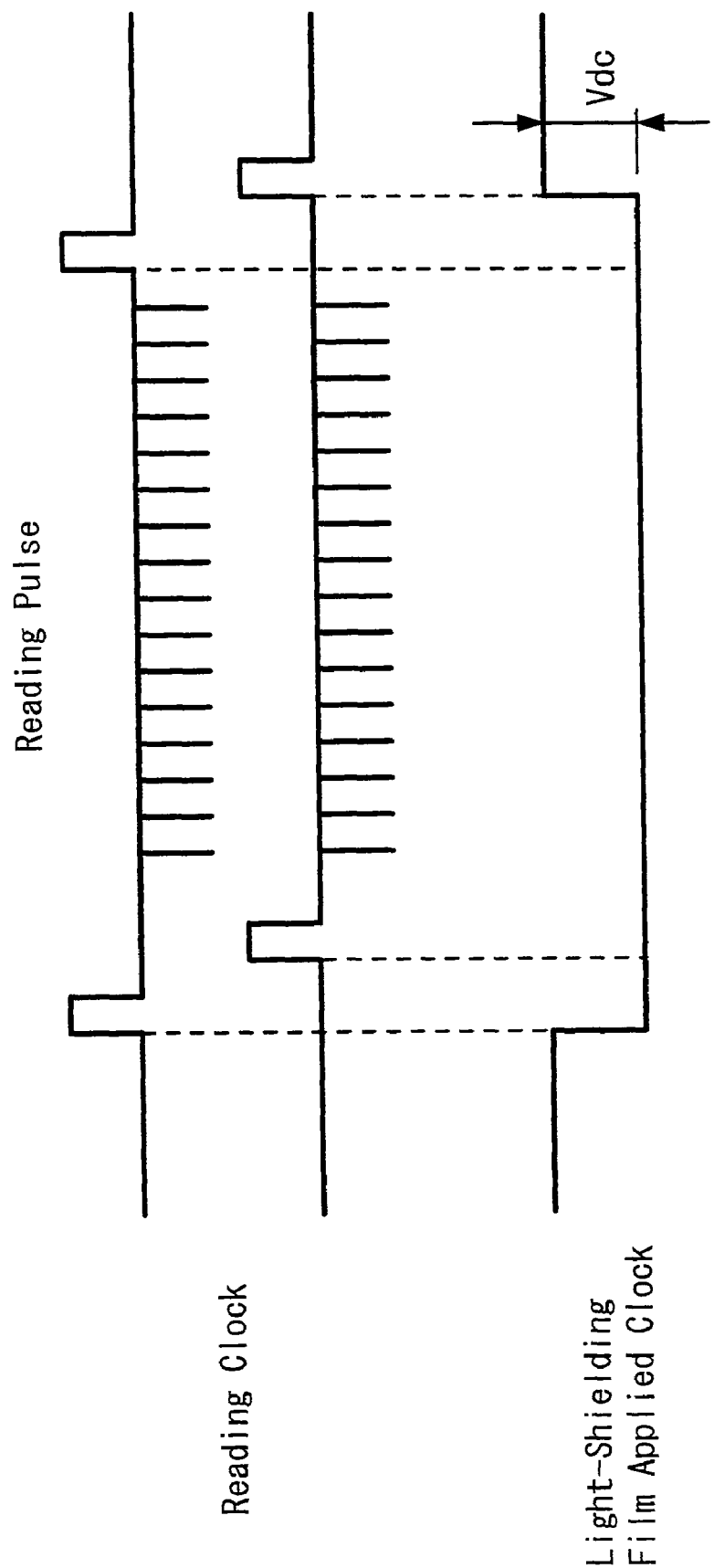
FIG. 18 is a diagram showing a relation between a readout pulse of a reading clock and the DC voltage Vdc of a clock applied to a light-shielding film.

In the solid-state imaging device 71 according to this embodiment, as shown in FIG. 18, when a reading pulse in the reading clock is obtained, DC voltage Vdc of a clock applied to the light-shielding film is made into ON-state based on the reading pulse to apply the DC voltage Vdc, for example, −0.1V to −10V, preferably −0.5V to −5V to the light-shielding film 41. If the DC voltage Vdc is less than −0.1V, though the Dc voltage Vdc is applied, the pinning on the surface of the sensor portion is not enhanced sufficiently. When the DC voltage Vdc exceeds −10V, it is most likely to raise a problem with voltage-resistance of the body of the solid-state imaging device 71. Therefore, the DC voltage Vdc is set within the above-described limits.

The solid-state imaging device 71 according to this embodiment is capable of suppressing the noise generation by applying a voltage on the light-shielding film 41. Furthermore, since the light-shielding film 41 is connected to DC supply source 51, the pinning on the surface of the sensor portion 34 is enhanced. Moreover, by applying a minus voltage at the time of charge transfer, the potential barrier of the reading gate 40 can be set high and the blooming characteristic can be improved.

Figure 19A:
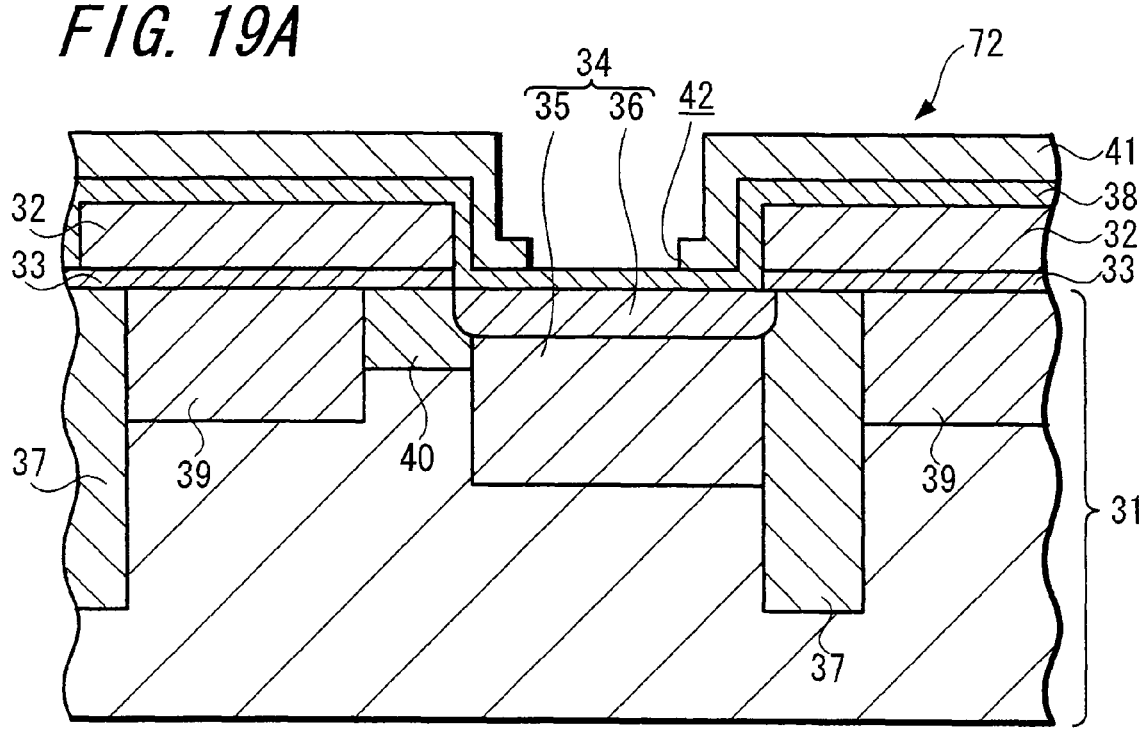
FIGS. 19A and 19B show a second embodiment according to a solid-state imaging device and the driving method thereof.
Figure 19B:
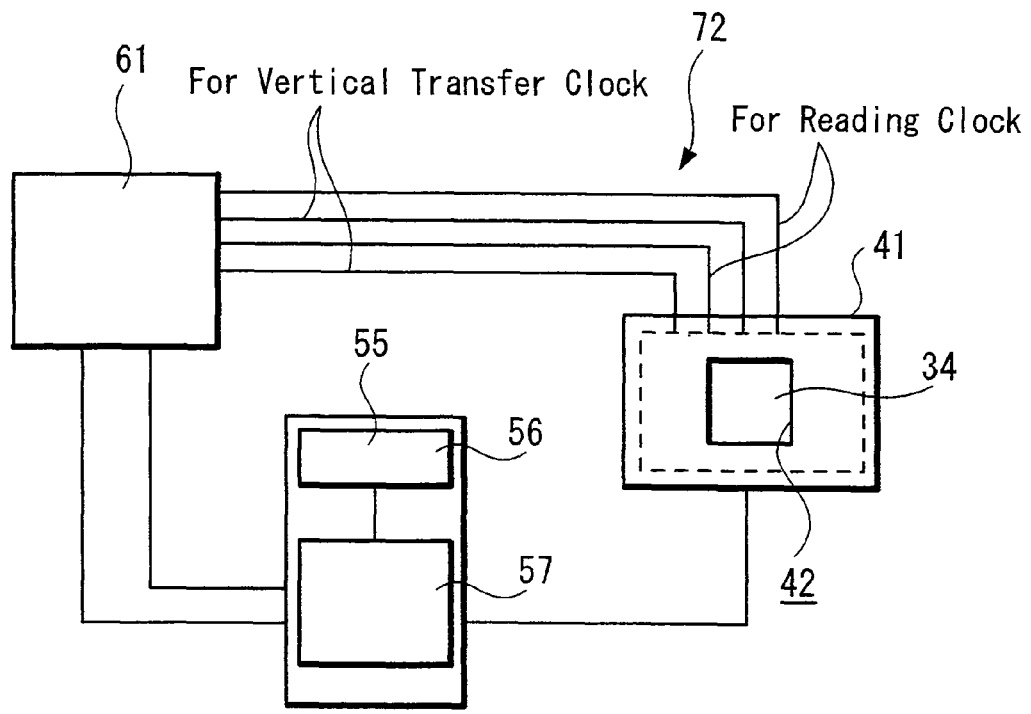

Next, a second embodiment with respect to the solid-state imaging device and the driving method thereof according to the present invention will be described with reference to FIG. 19. FIG. 19A is a schematic structure section showing a relevant part of the solid-state imaging device; and FIG. 19B is a structure diagram of a relevant part of the solid-state imaging device. Note that, the solid-state imaging device includes a large number of pixels, however, FIG. 19 shows about one pixel as a representative.

As is shown in FIG. 19A, the solid-state imaging device 72 in this embodiment has an electrode 32 serving as both the reading electrode and transfer electrode formed on a semiconductor substrate 31 through an insulating film 33. A reading gate 40 is formed on the semiconductor substrate 31 under a portion of the electrode 32 serving as the reading electrode. A vertical register 39 made of a charge-coupled device is formed on the semiconductor substrate 31 under a portion of the electrode 32 serving as the transfer electrode. Further, a sensor portion 34 is formed between the electrode 32 and another electrode 32 of an adjacent pixel. This sensor portion 34 is made of, for example, HAD; and for example, an n-type diffusion layer 35 is formed to make a pn junction with a p-type diffusion layer 36 formed thereon. In other words, the p-type diffusion layer is formed on the side of the surface of the sensor portion 34. Further, a channel stop layer 37 is formed between the sensor portion 34 and the adjacent pixel area. Thus, when a pixel is seen in a horizontal transfer direction, the channel stop layer 37, vertical register 39, reading gate 40, and sensor portion 34 are arranged in order.

Further, a light-shielding film 41 having an opening 42 above the sensor portion 34 is formed through an insulating film 38 covering the electrode 32, sensor portion 34, and the like.

As is shown in FIG. 19B, this light-shielding film 41 is formed of, for example, tungsten and is connected to a pulse supply source 55. The pulse supply source 55 includes, for example, an AC power source 56 for supplying an AC voltage and a pulse regulator 57 for changing the pulse to a pulse of a desired voltage. The sensor portion 34 of the solid-state imaging device 72 covered with the light-shielding film 41 converts received light into an electric signal by photoelectric conversion, and receives a reading clock to send the signal to a driver/transfer gate 61. The driver/transfer gate 61 receives a vertical transfer clock to transfer the signal in a vertical direction. Furthermore, the driver/transfer gate 61 receives the reading clock to make an instruction about the application of pulse voltage to the light-shielding film 41.

In the solid-state imaging device 72 according to this embodiment, as shown in FIG. 20, when a reading pulse in the reading clock is obtained, pulse voltage Vp of a clock applied to the light-shielding film is made into ON-state based on the reading pulse to apply the pulse voltage Vp, for example, 0.1V to 15V, preferably 0.5V to 5V to the light-shielding film 41. If the pulse voltage Vp is less than 0.1V, though the pulse voltage Vp is applied, the reading is not sufficiently assisted and a high reading voltage is required. When the pulse voltage Vp exceeds 15V, it is most likely to raise a problem with voltage-resistance of the body of the solid-state imaging device 72. Therefore, the pulse voltage Vp is set within the above-described range.

In addition, the pulse voltage Vp can be applied together with the DC voltage Vdc. For example, after the DC voltage Vdc is applied, the pulse voltage Vp may be superimposed thereon. In this case, it is possible to obtain both of the effectiveness by applying DC voltage and the effectiveness by applying pulse voltage at the same time.

The solid-state imaging device 72 according to this embodiment is capable of suppressing the noise generation by applying the voltage to the light-shielding film 41. Furthermore, since the light-shielding film 41 is connected to the pulse supply source 55, a pulse synchronized with the reading pulse can be applied to the light-shielding film 41; thus, it is possible to assist reading and to reduce the reading voltage.

Figure 21A:
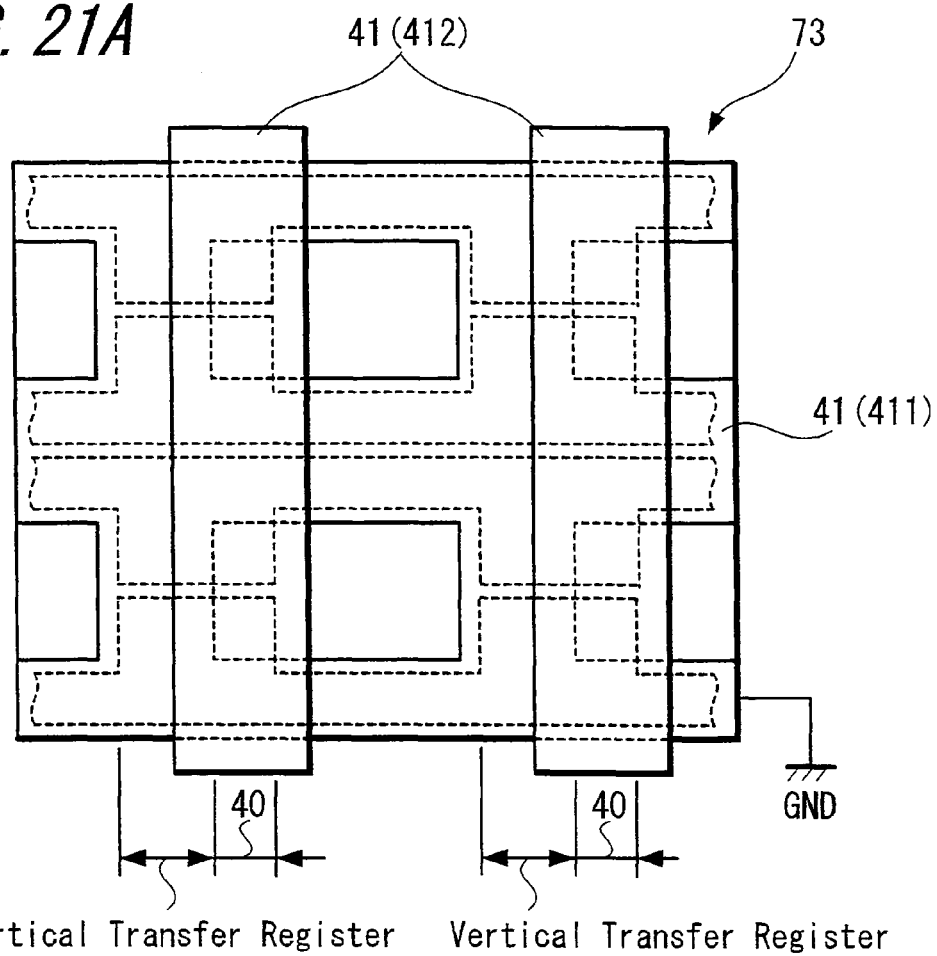
FIGS. 21A-21B show a third embodiment according to a solid-state imaging device and the driving method thereof of the present invention.
Figure 21B:
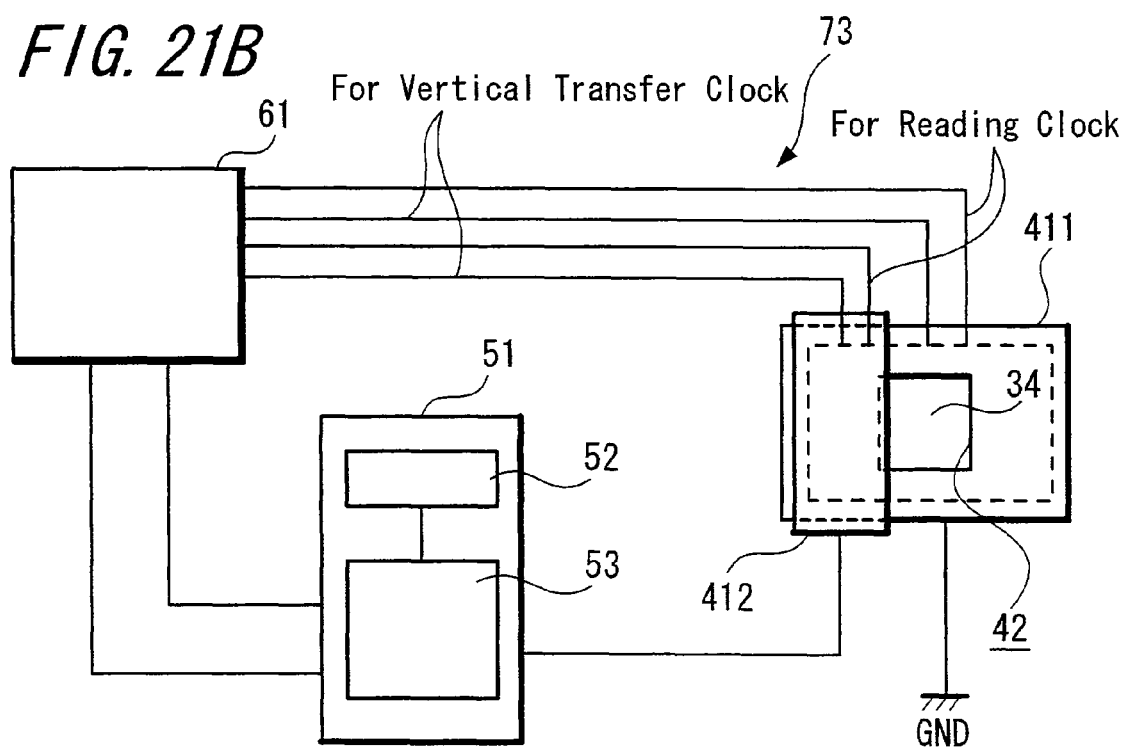

Next, a third embodiment with respect to the solid-state imaging device and the driving method thereof according to the present invention will be described with reference to FIG. 21. FIG. 21A is a layout diagram showing a relevant part of the solid-state imaging device; and FIG. 21B is a structure diagram of a relevant part of the solid-state imaging device. In this third embodiment, the light-shielding film in the solid-state imaging device according to the first embodiment is modified in structure. The other structure thereof is the same as that described referring to FIG. 17A. Note that, the solid-state imaging device includes a large number of pixels, however, FIG. 21 shows about one pixel as a representative.

As is shown in FIG. 21A, the solid-state imaging device 73 in this embodiment has the light-shielding film 41 formed of a plurality of layers (here two layers by way of example). A first light-shielding film 411 has an opening above the sensor portion 34, covers the whole surface of non-photoelectric conversion area on the side of the sensor portion 34 in the solid-state imaging device 73, and is connected to the ground GND. A second light-shielding film 412 is formed on the first light-shielding film 411 under the second light-shielding film 412 through an insulating film (not shown), projects from one side (for example, on the side of the reading gate 40) of the opening 42 in the first light-shielding film 411 toward the sensor portion 34, and is connected to a DC supply source (not shown). The second light-shielding film 412 is preferably formed on the side of reading gate 40.

As is seen in FIG. 21B, the first light-shielding film 411 formed of, for example, tungsten, has the opening above the sensor portion 34, covers the whole surface of the non-photoelectric conversion area on the side of the sensor portion 34, and is connected to the ground GND. The second light-shielding film 412 formed of, for example, tungsten is connected to a DC supply source 51. The DC supply source 51 includes a power supply 52 for supplying, for example, DC voltage and a voltage converter 53 for converting the voltage to a desired voltage. The sensor portion 34 in the solid-state imaging device 73 converts received light into an electric signal by photoelectric conversion, and receives a reading clock to send the signal to a driver/transfer gate 61. The driver/transfer gate 61 receives a vertical transfer clock to send the signal in a vertical direction. Further, the driver/transfer gate 61 receives the reading clock to make an instruction about applying the DC voltage to the second light-shielding film 412.

In the solid-state imaging device 73 according to this embodiment, as shown in FIG. 22, when the reading pulse in the reading clock is obtained, DC voltage Vdc of a clock applied to the light-shielding film is made into ON-state based on the reading pulse to apply the DC voltage Vdc, for example, −0.1V to −10V, preferably −0.5V to −5V to the light-shielding film (the second light-shielding film). In the case where the DC voltage Vdc is less than −0.1V, though the Dc voltage Vdc is applied, the pinning on the surface of the sensor portion is not sufficiently enhanced. When the DC voltage Vdc exceeds −10V, it is highly probable that a problem with voltage-resistance of the body of the solid-state imaging device 73 will be raised. Therefore, the DC voltage Vdc is set within the above-described range.

The solid-state imaging device 73 according to this embodiment is capable of suppressing the noise generation by applying the voltage to the second light-shielding film 412. Further, since the second light-shielding film 412 is connected to the DC supply source 51, the pinning on the surface of the sensor portion 34 is enhanced. Moreover, by applying the minus voltage at the time of charge transfer, the potential barrier of reading gate 40 can be set high and thus the blooming characteristic can be improved.

Figure 23A:
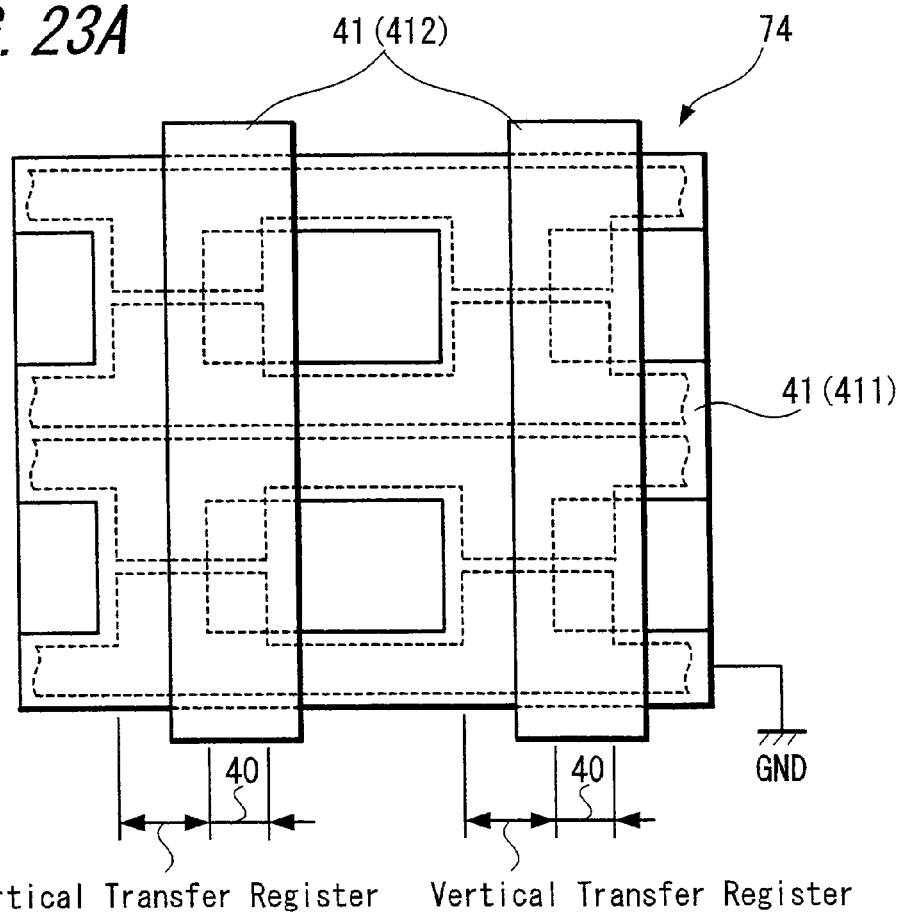
FIGS. 23A and 23B show a fourth embodiment according to a solid-state imaging device and the driving method thereof.
Figure 23B:
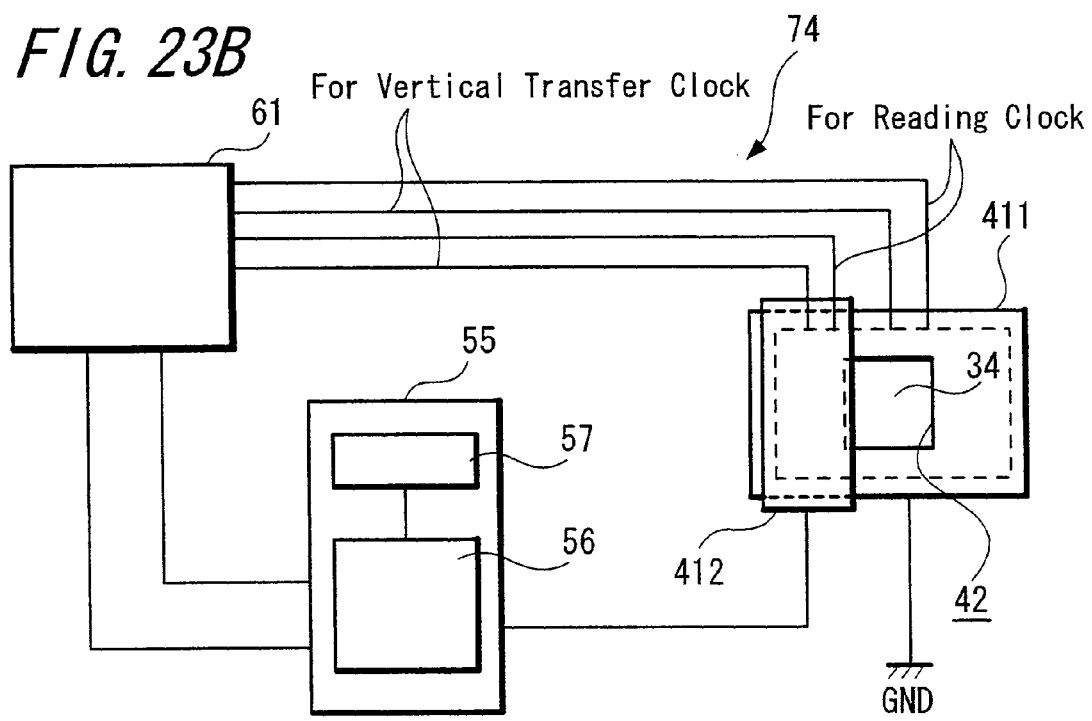

Next, a fourth embodiment with respect to the solid-state imaging device and the driving method thereof according to the present invention will be described with reference to a schematic structure diagram of FIG. 23. FIG. 23A is a layout diagram showing a relevant part of the solid-state imaging device; and FIG. 23B is a structure diagram showing a relevant part of the solid-state imaging device. In the fourth embodiment, the light-shielding film is different in structure from that of the solid-state imaging device according to the second embodiment. The other structure is the same as described referring to FIG. 19A. Note that, the solid-state imaging device includes a large number of pixels, however, FIG. 23 shows about one pixel as a representative.

As is shown in FIG. 23A, the solid-state imaging device 74 in this embodiment has the light-shielding film 41 formed of a plurality of layers (here two layers by way of example). A first light-shielding film 411 has an opening above the sensor portion 34, covers the whole surface of a non-photoelectric conversion area on the side of the sensor portion 34 in the solid-state imaging device 74, and is connected to the ground GND. A second light-shielding film 412 is formed on the first light-shielding film 411 under the second light-shielding film 412 through an insulating film (not shown), projects from one side (for example, on the side of the reading gate 40) of the opening 42 in the first light-shielding film 411 toward the sensor portion 34, and is connected to a pulse supply source (not shown). The second light-shielding film 412 is preferably formed on the side of the reading gate 40.

As is seen in FIG. 23B, the first light-shielding film 411 formed of, for example, tungsten, has the opening above the sensor portion 34, covers the whole surface of the non-photoelectric conversion area on the side of the sensor portion 34, and is connected to the ground GND. The second light-shielding film 412 formed of, for example, tungsten is connected to a pulse supply source 55. The pulse supply source 55 includes an AC power supply 56 for supplying, for example, AC voltage and a pulse regulator 57 for converting the pulse to a pulse of desired voltage. The sensor portion 34 in the solid-state imaging device 74 converts received light into an electric signal by photoelectric conversion, and receives a reading clock to send the signal to a driver/transfer gate 61. The driver/transfer gate 61 receives a vertical transfer clock to send the signal in a vertical direction. Further, the driver/transfer gate 61 receives the reading clock to make an instruction about applying the pulse voltage to the second light-shielding film 412.

Figure 24:
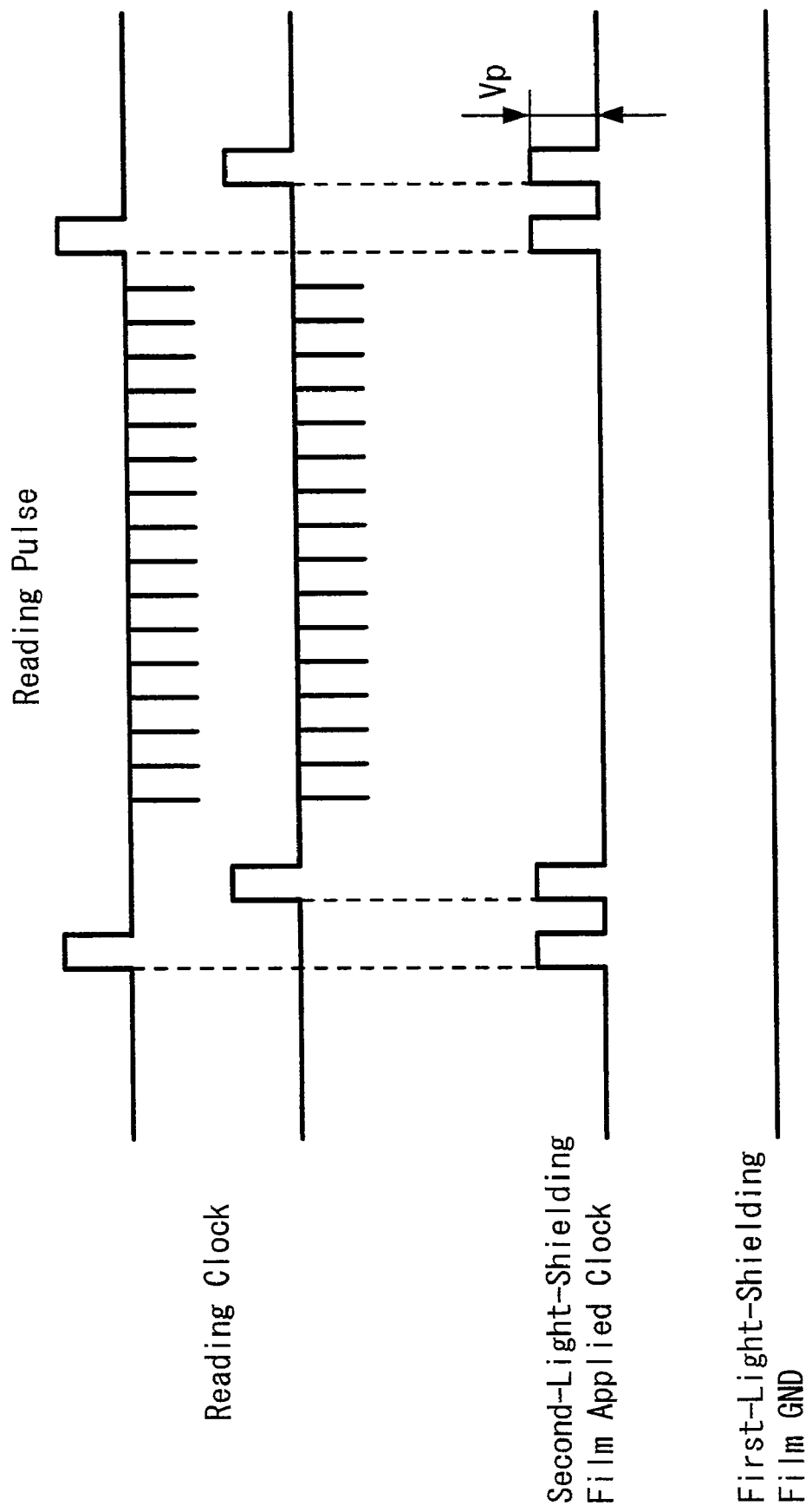
FIG. 24 is a diagram showing a relation between a reading pulse of a reading clock and the pulse voltage Vp of a clock applied to a light-shielding film.

In the solid-state imaging device 74 according to this embodiment, as shown in FIG. 24, when the reading pulse in the reading clock is obtained, pulse voltage Vp of a clock applied to the light-shielding film is made into ON-state based on the reading pulse to apply the pulse voltage Vp, for example, 0.1V to 15V, preferably 0.5V to 5V on the light-shielding film. If the pulse voltage Vp is less than 0.1V, though the pulse voltage Vp is applied, the reading is not sufficiently assisted and a high reading voltage will be required. When the pulse voltage Vp exceeds 15V, it is highly probable that a problem with voltage-resistance of the body of solid-state imaging device 74 will be raised. Therefore, the pulse voltage Vp is set within the above range.

The solid-state imaging device 74 according to this embodiment is capable of suppressing the noise generation by applying the voltage to the second light-shielding film 412. Further, since the second light-shielding film 412 is connected to the pulse supply source 55, a pulse synchronized with the reading pulse can be applied to the second light-shielding film 412; thus, it is possible to assist reading and to reduce the reading voltage. For this reason, it is efficient that the second light-shielding film 412 to which the pulse voltage is applied is arranged particularly on the side of the electrode 32 above the reading gate 40, that is, the reading electrode 32.

The pulse voltage can be applied together with DC voltage. For example, after DC voltage is applied, the pulse voltage can be superimposed thereon. In this case, it is possible to obtain both of the effectiveness by applying DC voltage and the effectiveness by applying the pulse voltage at the same time.

A fifth embodiment with respect to the solid-state imaging device and the driving method thereof according to the present invention will be described with reference to a schematic structure diagram of FIG. 25.

Figure 25:
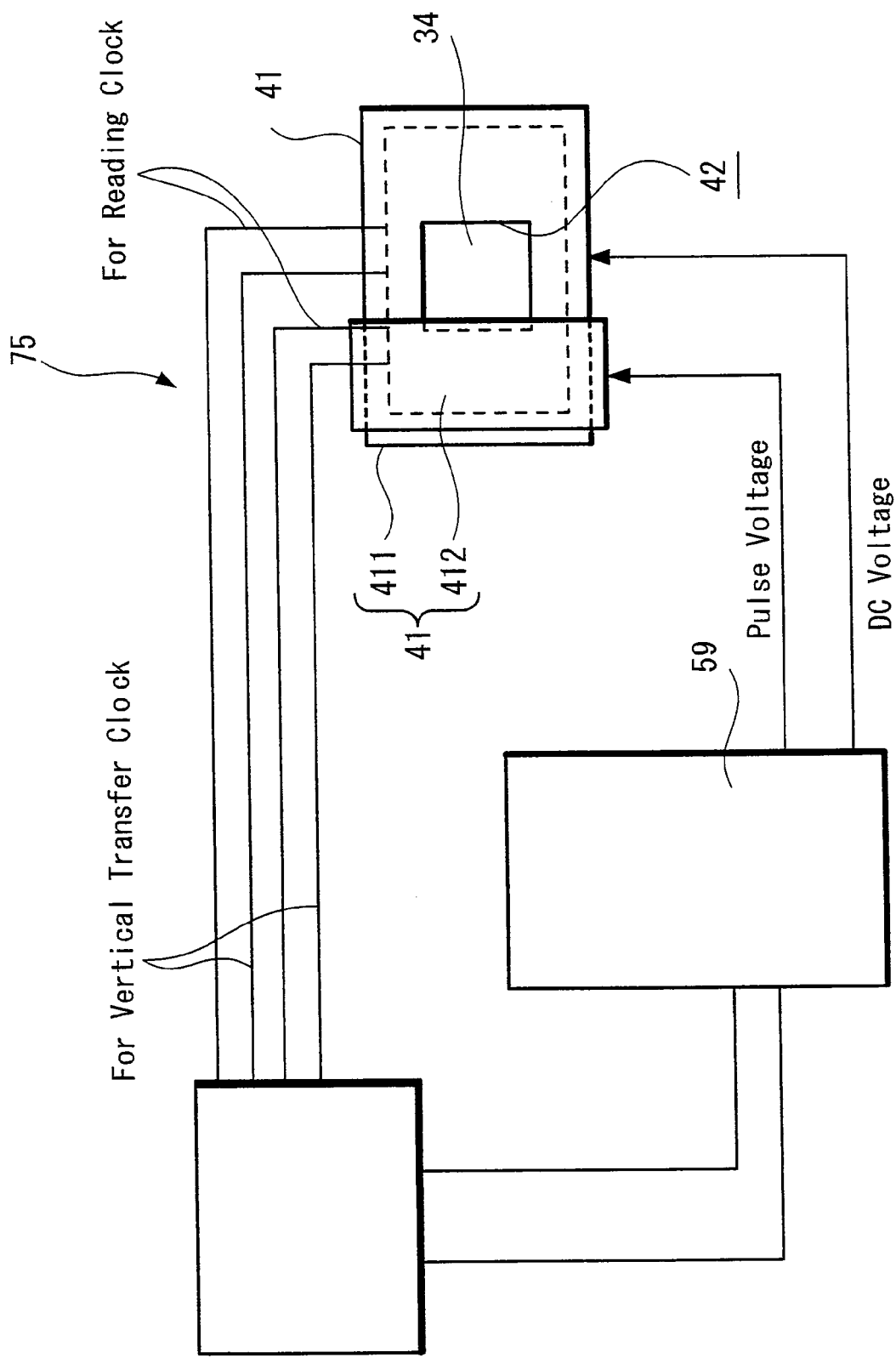
FIG. 25 is a schematic structure section showing a fifth embodiment according to a solid-state imaging device and the driving method thereof of the present invention.

As is shown in FIG. 25, the solid-state imaging device 75 according to this embodiment has the light-shielding film 41 formed of two layers similarly to the third and fourth embodiments described above. The light-shielding film is connected to a power supply 59 so that DC voltage will be applied to the first light-shielding film 411 and the pulse voltage will be applied to the second light-shielding film 412. In other words, the power supply 59 is made of unit which generates the DC voltage and pulse voltage individually. A driving method in this case will be a combination of each operation of the third and fourth embodiments.

Next, a sixth embodiment with respect to the solid-state imaging device and the driving method thereof according to the present invention will be described with reference to a schematic structure section of FIG. 26.

Figure 26:
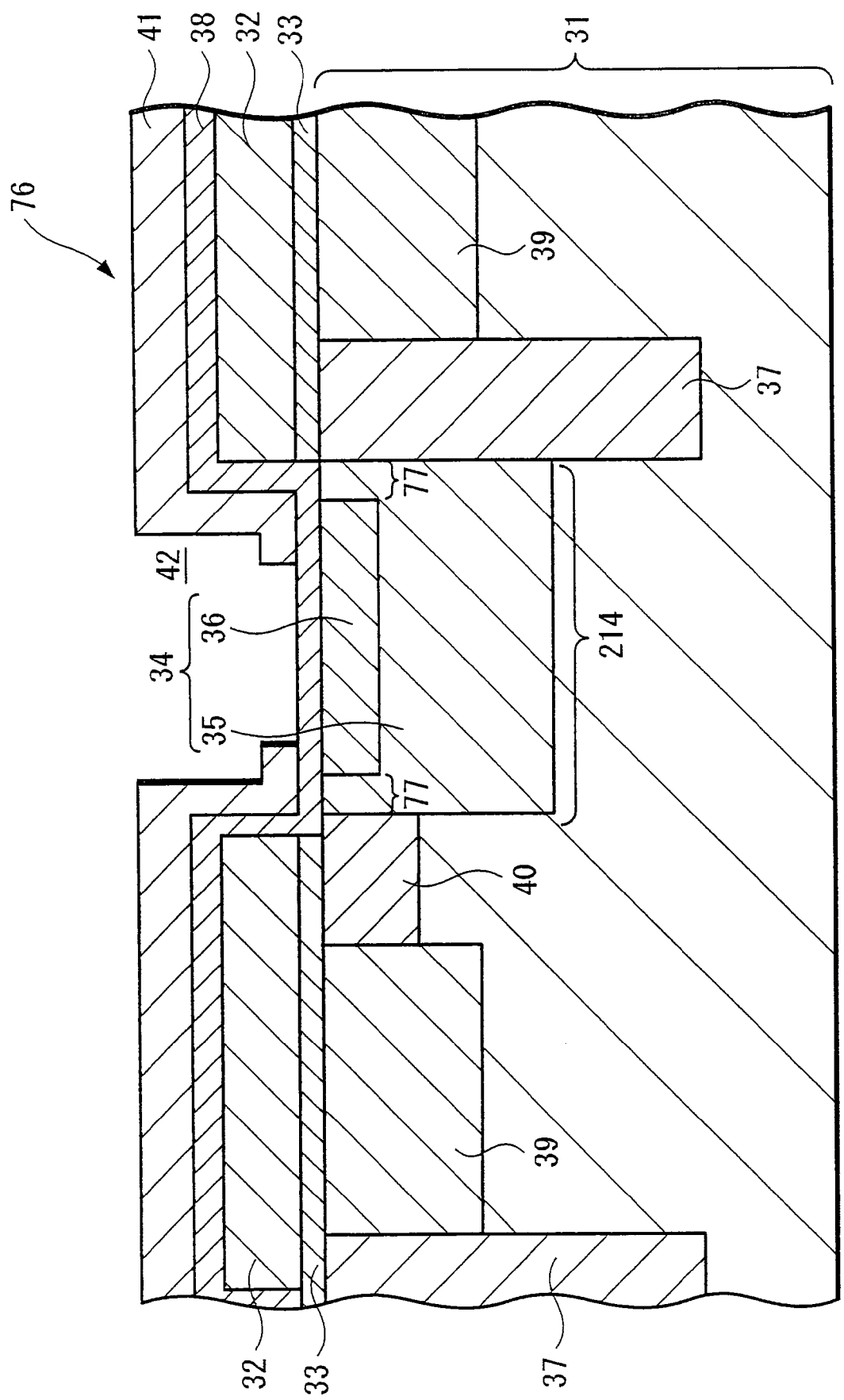
FIG. 26 is a schematic structure section showing a sixth embodiment according to a solid-state imaging device and the driving method thereof of the present invention.

As is shown in FIG. 26, the solid-state imaging device 76 in this embodiment has an electrode 32 serving as both the reading electrode and transfer electrode formed on a semiconductor substrate 31 through an insulating film 33. A reading gate 40 is formed on the semiconductor substrate 31 under a portion of the electrode 32 serving as the reading electrode. A vertical register 39 made of a charge-coupled device is formed on the semiconductor substrate 31 under a portion of the electrode 32 serving as the transfer electrode. Further, a sensor portion 34 is formed between the electrode 32 and another electrode 32 of an adjacent pixel. This sensor portion 34 is made of, for example, HAD; and for example, a p-type diffusion layer 36 is formed to make a pn junction with an n-type diffusion layer 35 formed thereon. Further, a channel stop layer 37 is formed between the sensor portion 34 and the adjacent pixel area. Thus, when one pixel is seen in a horizontal direction, the channel stop layer 37, vertical register 39, reading gate 40, and sensor portion 34 are arranged in order.

The p-type diffusion layer 36 is formed to leave the n-type diffusion layer 35 on the side of the reading gate 40 and on the side of the channel stop layer 37. Each portion left of the n-type diffusion layer is made to be an offset area 77.

Moreover, a light-shielding film 41 having the opening 42 above the sensor portion 34 is formed through an insulating film 38 covering the electrode 32, sensor portion 34, and the like.

The light-shielding film 41 can have the structure of the light-shielding film in each of the first to fifth embodiments described above. In other words, as described with the first embodiment, the light-shielding film can be connected to DC supply source for applying DC voltage. Or as described with the second embodiment, the light-shielding film can be connected to the pulse supply source for applying pulse voltage. Or as described with the third embodiment, the light-shielding film formed of a plurality of layers can be employed; in which the first light-shielding film in the plurality of layers has the opening above the sensor portion, covers the non-photoelectric conversion area on the side of the sensor portion in the solid-state imaging device and is grounded, and the second light-shielding film in the plurality of layers is formed on the light-shielding film under the second light-shielding film through an insulating film, projects from one side of the opening of the first light-shielding film to the sensor portion, and is connected to DC supply source. Or, as described with the fourth embodiment, the light-shielding film formed of a plurality of layers can be employed; in which the first light-shielding film in the plurality of layers has the opening above the sensor portion, covers the non-photoelectric conversion area on the side of the sensor portion in the solid-state imaging device and is grounded, and the second light-shielding film in the plurality of layers is formed on the light-shielding film under the second light-shielding film through an insulating film, projects from one side of the opening in the first light-shielding film to the sensor portion, and is connected to the pulse supply source. It is preferable that the second light-shielding film is formed on the side of the reading electrode. Or, as described with the fifth embodiment, the light-shielding film formed of a plurality of layers can be employed; in which the first light-shielding film in the plurality of layers has the opening above the sensor portion, covers the non-photoelectric conversion area on the side of the sensor portion in the solid-state imaging device, to which DC voltage is applied, and the second light-shielding film in the plurality of layers is formed on the light-shielding film under the second light-shielding film through an insulating film, projects from one side of the opening in the first light-shielding film to the sensor portion, to which pulse voltage is applied. It is preferable that the second light-shielding film is formed on the side of the reading electrode. Note that, FIG. 26 shows a single layer of the light-shielding film as an example.

Further, the method of applying the DC voltage or pulse voltage on the light-shielding film is the same as that described above with the first to fourth embodiments.

In the solid-state imaging device 76 according to this embodiment, the sensor portion 34 has an offset area 77 on the side of the reading gate 40 of the solid-state imaging device 76 and on the side of the channel stop layer 37 of an adjacent pixel, respectively. This prevents the p-type layer 36 of the sensor portion 34 from diffusing toward the reading gate 40, so that the reading voltage can be suppressed low and the dynamic margin to driving voltage will be widened. Further, because the p-type layer 36 will not diffuse under the transfer electrode of the vertical register 39 on the side of an adjacent pixel in a horizontal direction (toward the channel stop layer 37), the effective area of the vertical register 39 of an adjacent pixel is secured and the amount of electric charge handled by the vertical register 39 will be secured. The noise generation can be suppressed by applying the voltage on the light-shielding film 41. Since the light-shielding film 41 is connected to the DC supply source 51, the pinning on the surface of the sensor portion 34 is enhanced. Further, because the potential barrier of the reading gate 40 can be set high by applying a minus voltage at the time of charge transfer, the blooming characteristic can be improved. When the light-shielding film 41 is connected to a pulse supply source, a pulse synchronized with the reading pulse can be applied on the light-shielding film 41, so that the reading is assisted and the reading voltage can be reduced. It is efficient that the light-shielding film 41 to which pulse voltage is applied is arranged particularly on the side of the reading electrode.

Furthermore, the pulse voltage can be applied together with the DC voltage. For example, after DC voltage is applied, the pulse voltage can be superimposed thereon. In this case, it is possible to obtain both of the effectiveness by applying DC voltage and the effectiveness by applying pulse voltage at the same time.

Next, an embodiment of a method of manufacturing the solid-state imaging device according to the present invention, in which a two-layer light-shielding film is formed will be described below. Note that, the same components as those described with each of the above embodiments are denoted by the same symbols for explanation.

Using the known method of manufacturing a solid-state imaging device, on the semiconductor substrate 31 are formed the reading gate 40, vertical register 39, channel stop layer 37, and the like; further, on the semiconductor substrate 31 is formed the electrode 32 serving as the charge-reading electrode and charge-transfer electrode through an insulating film. In an area serving as the sensor portion 34 is formed the n-type diffusion layer 35, on the surface of which the p-type diffusion layer 36 is formed. Moreover, the interlayer insulation film 38 covering the electrode 32 and sensor portion 34 is formed.

Subsequently, after the first light-shielding film 411 has been formed on the interlayer insulation film 38, the opening 42 is formed in the first light-shielding film 411 above the sensor portion 34 using an ordinary lithography technique and etching technique. After that, the second light-shielding film 412 is formed on the first light-shielding film 411 through an insulating film so as to project from one side of the opening 42 in the first light-shielding film 411 toward the sensor portion 34. As a result, the light-shielding film 41 having such structure as described above referring to FIG. 21A or FIG. 23A is formed.

Next, an embodiment of a method of manufacturing the solid-state imaging device according to the present invention, in which the sensor portion has the offset area, will be described with reference to a schematic structure section of FIG. 27. Since the sensor portion 34 except the p-type layer 36 is manufactured by the same method as before, a method of manufacturing the p-type layer 36 characterizing the present invention will be described here.

Figure 27A:
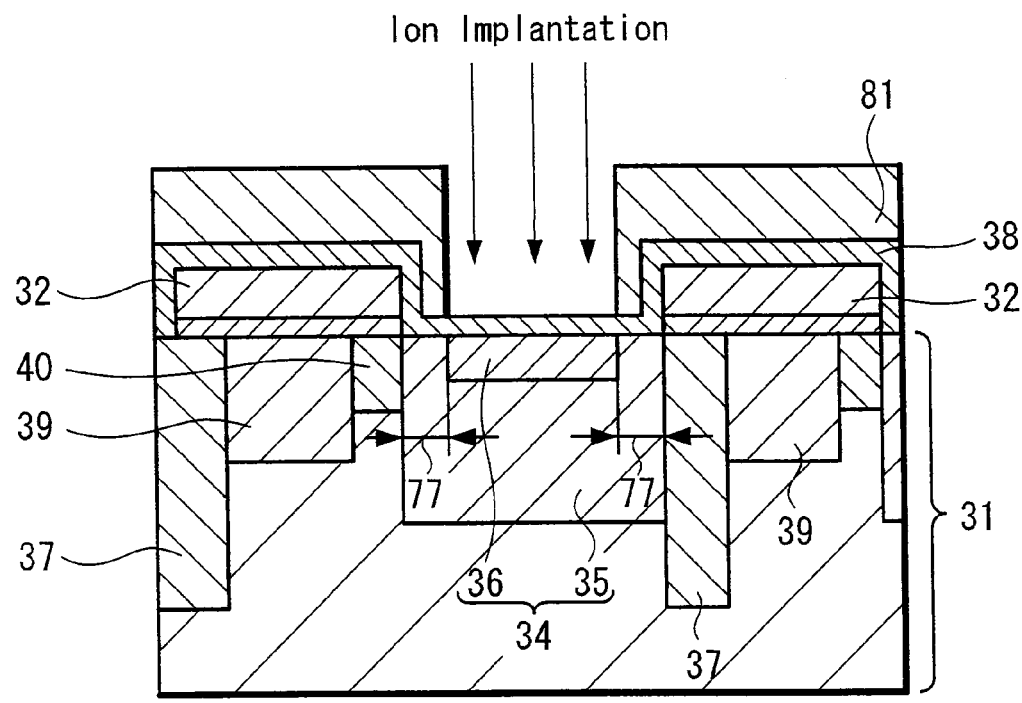
FIGS. 27A and 27B are schematic structure sections showing an embodiment according to a method of manufacturing a solid-state imaging device having an offset area in the sensor portion of the present invention.

As is shown in FIG. 27A, on the semiconductor substrate 31 are formed the reading gate 40, vertical register 39, channel stop layer 37, and the like by the known manufacturing method, and further on the semiconductor substrate 31 is formed the electrode 32 serving as the charge-reading electrode and charge-transfer electrode through an insulating film. In an area serving as the sensor portion 34 is further formed the n-type diffusion layer 35. Further, the interlayer insulation film 38 covering the electrode 32 and sensor portion 34 is formed.

After that, using the resist application technique and lithography technique, a resist mask 81 having an opening above the n-type diffusion layer 35 is formed to cover the end on the side of the reading gate 40 and the end on the side channel stop layer 37 of the n-type diffusion layer 35. Subsequently, by an ordinary ion-implantation method, p-type impurities are doped to the surface layer of the n-type diffusion layer 35 using the resist mask 81 as an ion-implantation mask. Then, after the resist mask 81 has been removed, a desired heat process is carried out to form the p-type diffusion layer 36 serving as the hole accumulated layer on the n-type diffusion layer 35. As a result, the n-type diffusion layer 35 on the side of the reading electrode (reading gate 40) and that on the side of the transfer electrode of an adjacent pixel (channel stop layer 37 for separating the adjacent pixel) are left to become the offset areas 77. In this way, an offset structure is formed. Thereafter, the light-shielding film described above with the first to fifth embodiments is formed. On that occasion, the light-shielding film is formed to have terminals (not shown) for connecting to the DC supply source or pulse supply source. This light-shielding film may be formed before the aforesaid heat process.

In the above-described manufacturing method, by making the n-type diffusion layer 35 on the side of the reading gate 40 and that on the side of the channel stop layer 37 of an adjacent pixel into the offset area 77 to form the p-type diffusion layer 36 on the n-type diffusion layer 35 using an ordinary ion-implantation method, the p-type diffusion layer 36 is formed separately from the reading gate 40 and channel stop layer 37 of the adjacent pixel by the offset area 77. This inhibits the p-type layer of the sensor portion 34 from diffusing toward the reading gate 40 in the heat process performed later, so that the reading voltage can be suppressed low and the dynamic margin to driving voltage will be broadened. Further, because the p-type diffusion layer 36 will not diffuse under the transfer electrode of the vertical register 39 on the side of an adjacent pixel in a horizontal direction (toward the channel stop layer 37), the effective area of the vertical register 39 is secured and the amount of electric charge handled by the vertical register 39 is secured. Moreover, this manufacturing method does not require the control of direction, angle or the like of ion implantation and can also reduce an effect of the diffusion thereby, so that it is possible to reduce an effect made on elements adjacent to the p-type diffusion layer 36 and make a size of a sensor smaller.

Figure 27B:
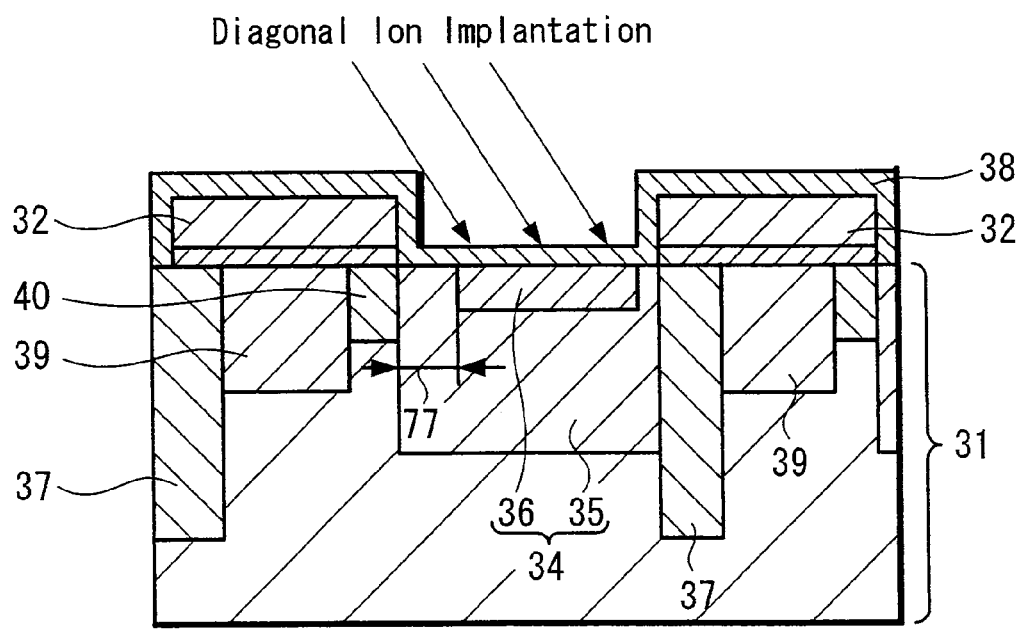
Figure 28:
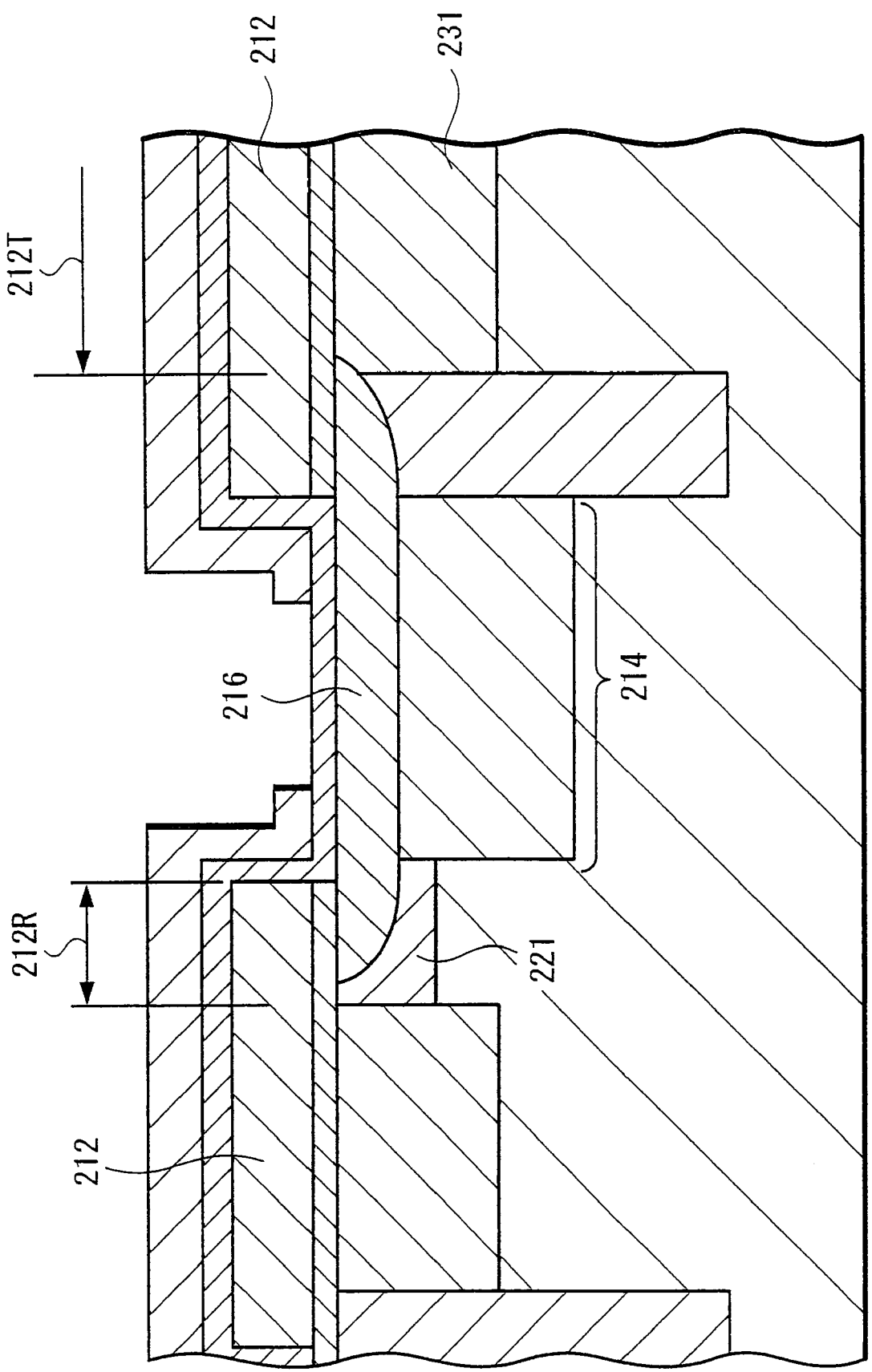
FIG. 28 is a schematic structure section for explaining a problem on the conventional solid-state imaging device.

Alternatively, the p-type diffusion layer 36 can be formed as follows. As is shown in FIG. 27B, on the semiconductor substrate 31 are formed the reading gate 40, vertical register 39, channel stop layer 37 and the like by the known manufacturing method; also, on the semiconductor substrate 31 is formed the electrode 32 serving as the charge-reading electrode and charge-transfer electrode through an insulating film. Further, in an area to be the sensor portion 34, the n-type diffusion layer 35 is formed. In addition, the interlayer insulation film 38 covering the electrode 32 and sensor portion 34 is formed.

After that, by an ordinary diagonal ion-implantation method in which the electrode 32, interlayer insulation film 38 and the like are used for the ion-implantation mask, p-type impurities are doped to the surface layer of the n-type diffusion layer 35. On that occasion, the direction of ion implantation is determined so that the side of the reading gate 40 may be shaded with the electrode 32 and interlayer insulation film 38. Subsequently, a desired heat process is carried out to form the p-type diffusion layer 36 serving as the hole accumulated layer on the n-type diffusion layer 35. As a result, the n-type diffusion layer 35 on the side of the reading electrode (reading gate 40) is left and the left area becomes an offset area 77. In this way, an offset structure is formed. Thereafter, the light-shielding film described above with the first to fifth embodiments is formed. On that occasion, the light-shielding film is formed to have terminals (not shown) for connecting to the DC supply source or pulse supply source. This light-shielding film may be formed before the above heat process.

In the above-described manufacturing method, by using the diagonal ion-implantation method making the n-type diffusion layer 35 on the side of the reading gate 40 into the offset area 77 to form the p-type diffusion layer 36 on the n-type diffusion layer 35, the p-type diffusion layer 36 is formed separately from the reading gate 40 by the offset area 77. This prevents the p-type diffusion layer 36 of the sensor portion 34 from diffusing toward the reading gate 40 in the heat process performed later, the reading voltage can be suppressed low and the dynamic margin to driving voltage is broadened. Moreover, since this manufacturing method can reduce the effect of diffusion by ion implantation, it is possible to reduce the effect made on elements adjacent to the p-type diffusion layer 36 and make the size of a sensor smaller.

Furthermore, the manufacturing method of forming the light-shielding film to be connected to DV source can suppress the noise generation by applying the voltage on the light-shielding film. Also, the pinning on the surface of the sensor portion is enhanced. In addition, by applying the minus voltage at the time of charge transfer, it is possible to set the potential barrier of the reading gate high and to improve the blooming characteristic. Furthermore, the manufacturing method of forming the light-shielding film to be connected to pulse supply source is capable of applying the synchronized pulse with the reading pulse, thus assisting the reading and reducing the reading voltage.

The present invention is not limited to the above-described embodiments and the other various modifications can be made without departing from the scope of the present invention.

According to the above-described solid-state imaging device of the present invention, with the structure in which a predetermined voltage signal can be applied to the light-shielding film or the other electrode that is electrically independent from the first electrode, the potential of each part is made variable and the potential can be corrected by applying the voltage signal. This makes it possible to improve the blooming characteristic, readout characteristic, pixel-separation characteristic, and noise characteristic by correcting the potential.

Moreover, according to the solid-state imaging device and a method for manufacturing the same of the present invention, by forming, at the end on the side of the electrode and at the end on the side of the pixel-separation area, the areas each containing a lower impurity concentration than that of the second-conductivity-type semiconductor area in the center on the surface of the first-conductivity-type semiconductor area serving as the photoelectric conversion area of the light-receiving sensor portion, it is possible to correct the potential depth at the ends on the surface of the light-receiving sensor portion to reduce the reading voltage on the side of the electrode and also to suppress the noise generation on the side of the pixel-separation area.

This makes it possible to improve more efficiently the readout characteristic and noise characteristic.

Therefore, the present invention can provide the solid-state imaging device having the satisfactory noise characteristic and readout characteristic.

Moreover, according to the present invention, since the satisfactory noise characteristic and readout characteristic can be obtained even though a pixel is miniaturized in size and the number thereof increases, by using the solid-state imaging device according to this invention, a camera or the like can be miniaturized and a high resolution and a high picture quality can be obtained.

According to the solid-state imaging device of the present invention, the application of the voltage on the light-shielding film can suppress the noise generation. Since the light-shielding film is connected to DC supply source, the pinning on the surface of the sensor portion is enhanced. The application of the minus voltage at the time of charge transfer makes it possible to set the potential barrier of the reading gate high and to improve the blooming characteristic. When the light-shielding film is connected to pulse supply source, the pulse synchronized with the reading pulse can be applied, so that it is possible to assist reading and to reduce the reading voltage. Consequently, the solid-state imaging device of high quality preventing the generation of dark current and having no defect can be provided. Further, an effective area of the vertical register can be enlarged.

According to the method of driving the solid-state imaging device of the present invention, the noise generation can be suppressed by applying the voltage to the light-shielding film. By applying DC voltage on the light-shielding film at the time of reading the solid-state imaging device, the pinning on the surface of the sensor portion can be enhanced. By applying the minus voltage at the time of charge transfer, it is possible to set the potential barrier of the reading gate high and to improve the blooming characteristic. The driving method of applying pulse voltage to the light-shielding film at the time of reading the solid pickup device can assist reading and reduce the reading voltage. Therefore, the solid-state imaging device of high quality preventing the generation of dark current and having no defect can be provided.

According to the solid-state imaging device of the present invention, because the sensor portion has the offset area provided between the reading gate and channel stop layer of an adjacent pixel in the solid-state imaging device, it is possible to suppress the reading voltage low and to broaden the dynamic margin to driving voltage. Further, an effective area of the vertical register can be secured and the amount of electric charge handled by the vertical register can be secured. Further, the application of the voltage on the light-shielding film can suppress the noise generation. Since the light-shielding film is connected to DC supply source, the pinning on the surface of the sensor portion can be enhanced. Furthermore, by applying the minus voltage at the time of charge transfer, it is possible to set the potential barrier of reading gate high and to improve the blooming characteristic. When the light-shielding film is connected to pulse supply source, the pulse synchronized with the reading pulse can be applied to the light-shielding film, so that it is possible to assist reading and to reduce the reading voltage. In addition, an effective area of the vertical register can be enlarged.

According to the method of manufacturing the solid-state imaging device of the present invention, because the offset areas are made in the n-type diffusion layer on the side of the reading gate and on the side of the channel stop layer of an adjacent pixel, and the p-type diffusion layer is formed on the n-type diffusion layer by the ion-implantation method, it is possible to form the p-type diffusion layer separately from the reading gate and channel stop layer of an adjacent pixel by the offset area. This makes it possible to manufacture the solid-state imaging device which is capable of suppressing the reading voltage low and of enlarging the dynamic margin to driving voltage. Further, an effective area of the vertical register can be secured and the amount of electric charge handled by the vertical register can be secured. Further, the application of the voltage on the light-shielding film can suppress the noise generation. Since the light-shielding film is connected to DC supply source, the pinning on the surface of the sensor portion can be enhanced. Further, by applying the minus voltage at the time of charge transfer, it is possible to set the potential barrier of the reading gate high and to improve the blooming characteristic. When the light-shielding film is connected to pulse supply source, reading can be assisted to reduce the reading voltage.

What is claimed is:

1. A method of manufacturing a solid-state imaging device comprising the steps of:
   providing on one side of a light-receiving sensor portion constituting a pixel an electrode for reading a signal charge from said light-receiving sensor portion,
   forming a light-shielding film covering an image pickup area except said light-receiving sensor portion, to which a predetermined voltage signal is applied; and
   forming a second-conductivity-type semiconductor area in the center on the surface of a first-conductivity-type semiconductor area constituting a photoelectric conversion area of said light-receiving sensor portion,
   wherein,
      after said first-conductivity-type semiconductor area is formed, said second-conductivity-type semiconductor area is formed in the center on the surface of said first-conductivity-type semiconductor area, and an area containing a lower impurity concentration than that of said second-conductivity-type semiconductor area is formed at the end on the side of said electrode and at the opposite end on the side of a pixel-separation area, on the surface of said first-conductivity-type semiconductor area, and
      when forming said second-conductivity-type semiconductor area and said area containing a lower impurity concentration than that of said second-conductivity-type semiconductor area, the ion implantation toward the end on the side of said electrode is performed separately from the ion implantation toward the opposite end on the side of the pixel-separation area.

2. A method of manufacturing a solid-state imaging device comprising the steps of:
   providing on one side of a light-receiving sensor portion constituting a pixel an electrode for reading a signal charge from said light-receiving sensor portion,
   forming a light-shielding film covering an image pickup area except said light-receiving sensor portion, to which a predetermined voltage signal is applied; and
   forming a second-conductivity-type semiconductor area in the center on the surface of a first-conductivity-type semiconductor area constituting a photoelectric conversion area of said light-receiving sensor portion,
   wherein,
      after said first-conductivity-type semiconductor area is formed, said second-conductivity-type semiconductor area is formed in the center on the surface of said first-conductivity-type semiconductor area, and an area containing a lower impurity concentration than that of said second-conductivity-type semiconductor area is formed at the end on the side of said electrode and at the opposite end on the side of a pixel-separation area, on the surface of said first-conductivity-type semiconductor area, and
      after said first-conductivity-type semiconductor area is formed, said light-shielding film is formed, an opening is formed in said light-shielding film above said light-receiving sensor portion, and the ion implantation is performed using said light-shielding film as a mask to form said second-conductivity-type semiconductor area.

* * * * *